(12) United States Patent
Katsuno et al.

(10) Patent No.: US 9,076,929 B2
(45) Date of Patent: Jul. 7, 2015

(54) SEMICONDUCTOR LIGHT EMITTING ELEMENT

(71) Applicant: Kabushiki Kaisha Toshiba, Minato-ku (JP)

(72) Inventors: Hiroshi Katsuno, Komatsu (JP); Shinji Saito, Yokohama (JP); Rei Hashimoto, Edogawa-ku (JP); Jongil Hwang, Nonoichi (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/315,681

(22) Filed: Jun. 26, 2014

(65) Prior Publication Data

US 2015/0001561 A1  Jan. 1, 2015

(30) Foreign Application Priority Data

Jul. 1, 2013 (JP) .................................. 2013-138301

(51) Int. Cl.
*H01L 29/72* (2006.01)
*H01L 33/38* (2010.01)
(Continued)

(52) U.S. Cl.
CPC ............. *H01L 33/382* (2013.01); *H01L 33/405* (2013.01); *H01L 25/0756* (2013.01); *H01L 33/22* (2013.01)

(58) Field of Classification Search
CPC .............................. H01L 33/08; H01L 33/405
USPC .................... 257/81, 91, 96, 98, 773
See application file for complete search history.

(56) References Cited

U.S. PATENT DOCUMENTS

2003/0214616 A1  11/2003  Komoto et al.
2004/0129944 A1*  7/2004  Chen ........................... 257/89

(Continued)

FOREIGN PATENT DOCUMENTS

EP  2 365 547 A2  9/2011
EP  2 365 547 A3  9/2011

(Continued)

OTHER PUBLICATIONS

The Partial European Search Report issued Nov. 5, 2014, in Application No. / patent No. 14175192.5-1551.

(Continued)

*Primary Examiner* — Edward Wojciechowicz
(74) *Attorney, Agent, or Firm* — Oblon, McClelland, Maier & Neustadt, L.L.P.

(57) ABSTRACT

According to one embodiment, a semiconductor light emitting element includes a first electrode, first and second light emitting units, first and second conductive layers, a first connection electrode, a first dielectric layer, first and second pads, and a first inter-light emitting unit dielectric layer. The first light emitting unit includes first and second semiconductor layers, and a first light emitting layer. The first semiconductor layer includes a first semiconductor portion and a second semiconductor portion. The second light emitting unit includes a third semiconductor layer, a fourth semiconductor layer, and a second light emitting layer. The fourth semiconductor layer is electrically connected with the first electrode. The first conductive layer is electrically connected with the third semiconductor layer. The second conductive layer is electrically connected with the second semiconductor layer. The first connection electrode electrically connects the first conductive layer and the first semiconductor portion.

20 Claims, 8 Drawing Sheets

(51) Int. Cl.
*H01L 25/075* (2006.01)
*H01L 33/40* (2010.01)
*H01L 33/22* (2010.01)

(56) References Cited

U.S. PATENT DOCUMENTS

| | | |
|---|---|---|
| 2007/0069220 A1 | 3/2007 | Ogihara |
| 2007/0096130 A1 | 5/2007 | Schiaffino et al. |
| 2008/0251799 A1 | 10/2008 | Ikezawa |
| 2011/0210345 A1 | 9/2011 | Lim et al. |
| 2011/0220944 A1 | 9/2011 | Choi et al. |
| 2011/0233575 A1 | 9/2011 | Huang et al. |
| 2012/0094414 A1 | 4/2012 | Or-Bach et al. |
| 2013/0292719 A1 * | 11/2013 | Lee et al. ............. 257/93 |

FOREIGN PATENT DOCUMENTS

| | | |
|---|---|---|
| EP | 2 378 553 A1 | 10/2011 |
| JP | 3378465 | 12/2002 |
| JP | 2007-095844 | 4/2007 |
| JP | 2008-263127 | 10/2008 |
| JP | 2011-211189 | 10/2011 |

OTHER PUBLICATIONS

European Office Action dated Mar. 19, 2015, issued in European Patent Application No. 14175192.5.

* cited by examiner

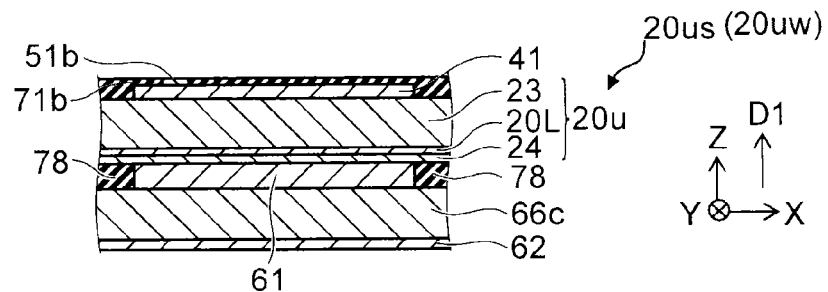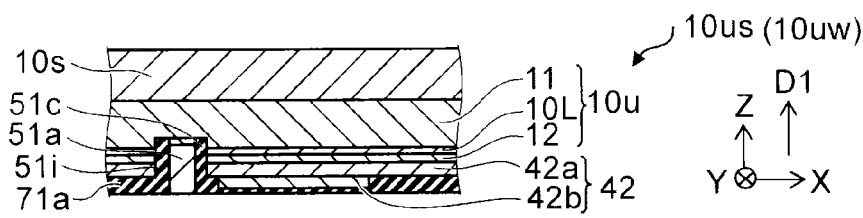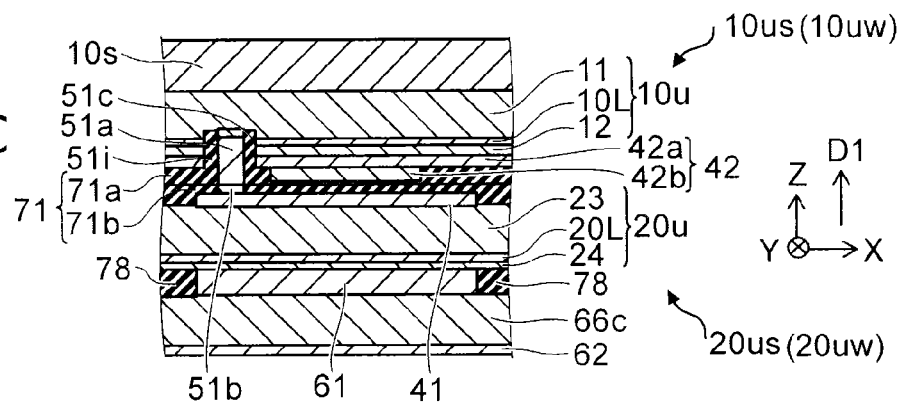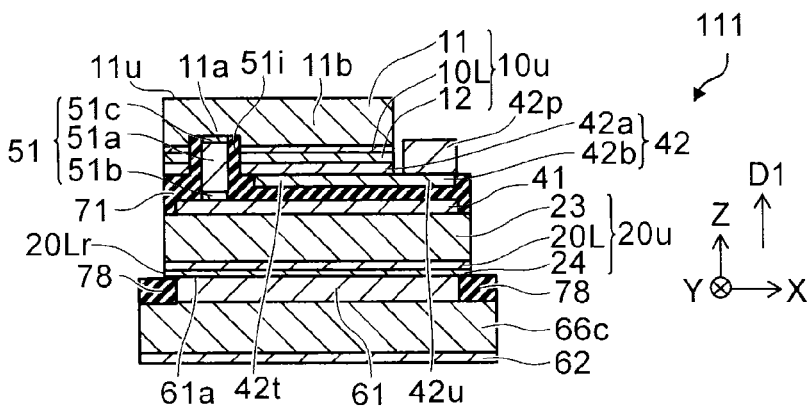

FIG. 9
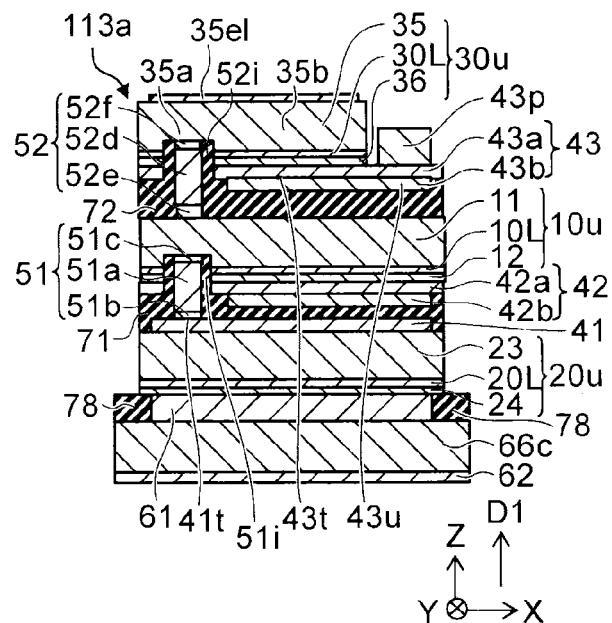
FIG. 10A
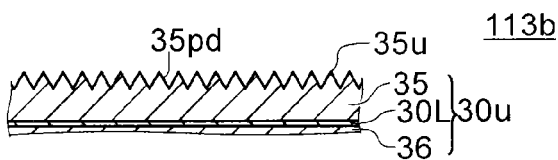 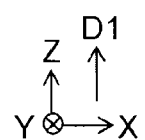
FIG. 10B
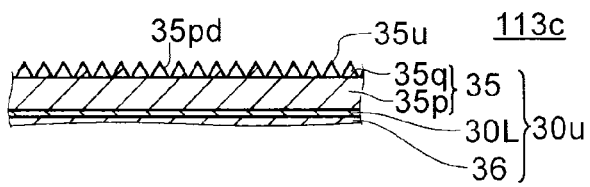 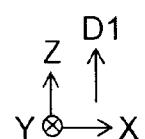

SEMICONDUCTOR LIGHT EMITTING ELEMENT

CROSS-REFERENCE TO RELATED APPLICATIONS

This application is based upon and claims the benefit of priority from Japanese Patent Application No. 2013-138301, filed on Jul. 1, 2013; the entire contents of which are incorporated herein by reference.

FIELD

Embodiments described herein relate generally to a semiconductor light emitting device.

BACKGROUND

A semiconductor light emitting element in which multiple LEDs (Light Emitting Diodes) are stacked has been proposed. Many light-shielding interconnects are provided in such a stacked semiconductor light emitting element. Therefore, the light extraction efficiency is low.

BRIEF DESCRIPTION OF THE DRAWINGS

FIG. 3A to FIG. 3C are schematic views showing the method for manufacturing the semiconductor light emitting element according to the first embodiment;

FIG. 4 is a schematic cross-sectional view showing another semiconductor light emitting element according to the first embodiment;

FIG. 9 is a schematic cross-sectional view showing another semiconductor light emitting element according to the first embodiment;

FIG. 10A and FIG. 10B are schematic cross-sectional views showing other semiconductor light emitting elements according to the first embodiment;

DETAILED DESCRIPTION

Figure 1A:
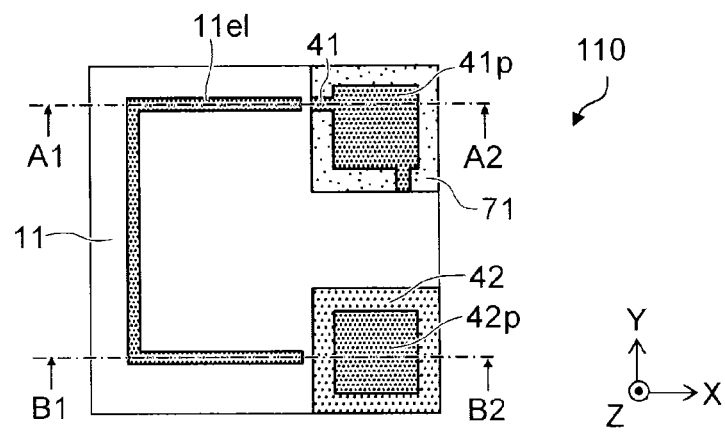
FIG. 1A to FIG. 1C are schematic views showing a semiconductor light emitting element according to the first embodiment.

According to one embodiment, a semiconductor light emitting element includes a first electrode, a first light emitting unit, a second light emitting unit, a first conductive layer, a second conductive layer, a first connection electrode, a first dielectric layer, a first pad, a second pad, and a first inter-light emitting unit dielectric layer. The first light emitting unit includes a first semiconductor layer, a second semiconductor layer, and a first light emitting layer. The first semiconductor layer is separated from the first electrode in a first direction and includes a first semiconductor portion and a second semiconductor portion. The second semiconductor portion is arranged with first semiconductor portion in a direction crossing the first direction. The second semiconductor layer is provided between the second semiconductor portion and the first electrode. The first light emitting layer is provided between the second semiconductor portion and the second semiconductor layer. The second light emitting unit includes a third semiconductor layer, a fourth semiconductor layer, and a second light emitting layer. The third semiconductor layer is provided between the first electrode and the first light emitting unit. The fourth semiconductor layer is provided between the third semiconductor layer and the first electrode. The fourth semiconductor layer is electrically connected with the first electrode. The second light emitting layer is provided between the third semiconductor layer and the fourth semiconductor layer. The first conductive layer includes a first pad disposition portion and a first inter-layer portion. The first inter-layer portion is provided between the first light emitting unit and the second light emitting unit. The first pad disposition portion is arranged with the first inter-layer portion in a direction crossing the first direction. The first conductive layer is electrically connected with the third semiconductor layer. The second conductive layer includes a second pad disposition portion and a second inter-layer portion. The second inter-layer portion is provided between the first light emitting unit and the second light emitting unit. The second pad disposition portion is arranged with the second inter-layer portion in a direction crossing the first direction. The second conductive layer is electrically connected with the second semiconductor layer. The first connection electrode extends in the first direction and electrically connects the first inter-layer portion and the first semiconductor portion. The first dielectric layer is provided between the first connection electrode and the second semiconductor layer, between the first connection electrode and the first light emitting layer, and between the first connection electrode and the second conductive layer. The first pad is electrically connected with the first pad disposition portion. The second pad is electrically connected with the second pad disposition portion. The first inter-light emitting unit dielectric layer is provided between the first light emitting unit and the second light emitting unit, between the first light emitting unit and the first conductive layer, between the second conductive layer and the second light emitting unit, and between the first conductive layer and the second conductive layer. The first inter-light emitting unit dielectric layer is light-transmissive.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
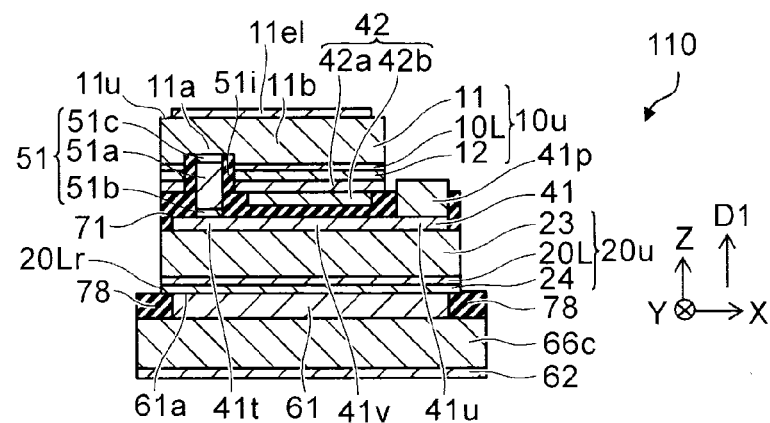
Figure 1C:
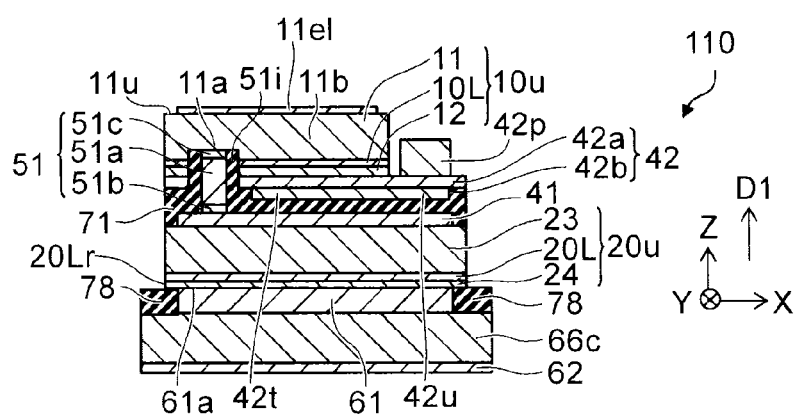

FIG. 1A to FIG. 1C are schematic views illustrating a semiconductor light emitting element according to the first embodiment.

FIG. 1A is a plan view. FIG. 1B is a line A1-A2 cross-sectional view of FIG. 1A. FIG. 1C is a line B1-B2 cross-sectional view of FIG. 1A.

As shown in FIG. 1B and FIG. 1C, the semiconductor light emitting element 110 according to the embodiment includes a first electrode 61, a first light emitting unit 10u, a second light emitting unit 20u, a first connection electrode 51, a first dielectric layer 51i, a first pad 41p, a second pad 42p, and a first inter-light emitting unit dielectric layer 71. In the example, a first conductive layer 41 and a second conductive layer 42 are further provided.

The first electrode 61 is light-reflective. The first electrode 61 includes, for example, at least one selected from Ag, Al, Rh, and Au. An alloy including the at least one selected from Ag, Al, Rh, and Au may be used as the first electrode 61.

The first light emitting unit 10u includes a first semiconductor layer 11, a second semiconductor layer 12, and a first light emitting layer 10L. The first semiconductor layer 11 is separated from the first electrode 61 in a first direction D1.

For example, a direction perpendicular to a major surface 61a of the first electrode 61 is taken as a Z-axis direction. One direction perpendicular to the Z-axis direction is taken as an X-axis direction. A direction perpendicular to the Z-axis direction and the X-axis direction is taken as a Y-axis direction. The first direction D1 is parallel to, for example, the Z-axis direction.

The first semiconductor layer 11 includes a first semiconductor portion 11a and a second semiconductor portion 11b. The second semiconductor portion 11b is arranged with the first semiconductor portion 11a in a direction crossing the first direction D1 (e.g., the Z-axis direction). For example, the second semiconductor portion 11b is arranged with the first semiconductor portion 11a in the X-Y plane. The first semiconductor layer 11 has a first conductivity type.

The second semiconductor layer 12 is provided between the second semiconductor portion 11b and the first electrode 61. The second semiconductor layer 12 has a second conductivity type. The second conductivity type is different from the first conductivity type.

The first light emitting layer 10L is provided between the second semiconductor portion 11b and the second semiconductor layer 12. The first light emitting layer 10L emits light (a first light) having a first peak wavelength. The first light emitting unit 10u is, for example, an LED chip.

The second light emitting unit 20u includes a third semiconductor layer 23, a fourth semiconductor layer 24, and a second light emitting layer 20L. The third semiconductor layer 23 is provided between the first electrode 61 and the first light emitting unit 10u. The third semiconductor layer 23 has a third conductivity type.

The fourth semiconductor layer 24 is provided between the third semiconductor layer 23 and the first electrode 61. The fourth semiconductor layer 24 is electrically connected with the first electrode 61. The fourth semiconductor layer 24 has a fourth conductivity type. The fourth conductivity type is different from the third conductivity type.

The second light emitting layer 20L is provided between the third semiconductor layer 23 and the fourth semiconductor layer 24. The second light emitting layer 20L emits light (a second light) having a second peak wavelength. The second light emitting unit 20u is, for example, an LED chip.

For example, the second peak wavelength is different from the first peak wavelength. For example, the second peak wavelength is shorter than the first peak wavelength. For example, the second light is blue light; and the first light is at least one selected from yellow light and red light. The color (the peak wavelength) of the light is arbitrary.

The side wall of the first light emitting unit 10u and the side wall of the second light emitting unit 20u may have tapered configurations. A separate dielectric may be formed on at least one selected from the side wall of the first light emitting layer 10L and the side wall of the second light emitting layer 20L.

For example, the first conductivity type is the same as the third conductivity type. For example, the second conductivity type is the same as the fourth conductivity type. For example, the first conductivity type and the third conductivity type are the n-type; and the second conductivity type and the fourth conductivity type are the p-type. In the embodiment, the first conductivity type and the third conductivity type may be the p-type; and the second conductivity type and the fourth conductivity type may be the n-type. In the embodiment, the first to fourth conductivity types are arbitrary. Hereinbelow, the case will be described where the first conductivity type and the third conductivity type are the n-type and the second conductivity type and the fourth conductivity type are the p-type.

These semiconductor layers include, for example, nitride semiconductors. For example, the first semiconductor layer 11 and the third semiconductor layer 23 include, for example, an n-type GaN layer. For example, the second semiconductor layer 12 and the fourth semiconductor layer 24 include, for example, a p-type GaN layer. The first light emitting layer 10L and the second light emitting layer 20L include, for example, a quantum well layer and a barrier layer. For example, a quantum well layer is provided between two barrier layers. The number of quantum well layers may be one or more.

The first conductive layer 41 includes a first inter-layer portion 41t and a first pad disposition portion 41u. The first inter-layer portion 41t is provided between the first light emitting unit 10u and the second light emitting unit 20u. The first pad disposition portion 41u is arranged with the first inter-layer portion 41t in a direction crossing the first direction D1. The first pad disposition portion 41u is not provided between the first light emitting unit 10u and the second light emitting unit 20u. The first conductive layer 41 is electrically connected with the third semiconductor layer 23.

In the example, the first conductive layer 41 further includes a first extension portion 41v. The first extension portion 41v extends between the first inter-layer portion 41t and the first pad disposition portion 41u. The first extension portion 41v connects the first inter-layer portion 41t and the first pad disposition portion 41u. The first extension portion 41v may be separated from the first inter-layer portion 41t and the first pad disposition portion 41u.

The first conductive layer 41 is, for example, light-shielding. The first conductive layer 41 is, for example, light-reflective. The first conductive layer 41 includes, for example, a metal. For example, a metal film of Al, Ni, Ti, etc., is used as the first conductive layer 41. An alloy may be used as the first conductive layer 41. A stacked film that includes multiple metal films may be used as the first conductive layer 41.

At least a portion of the first conductive layer 41 may be light-transmissive. In such a case, the first conductive layer 41 includes, for example, an oxide including at least one element selected from the group consisting of In, Sn, Zn, and Ti. The first conductive layer 41 includes, for example, ITO (Indium Tin Oxide), etc. The first conductive layer 41 may include a thin film of a metal.

The first connection electrode 51 is electrically connected with the first semiconductor portion 11a. The first connection electrode 51 extends in the first direction D1. The first connection electrode 51 is electrically connected with the third semiconductor layer 23. For example, the first connection electrode 51 is electrically connected with the first inter-layer portion 41t.

In the example, the first connection electrode 51 includes a first metal unit 51a and a second metal unit 51b. The first metal unit 51a is disposed between the first semiconductor portion 11a and at least a portion of the second metal unit 51b. The first metal unit 51a may contact, for example, the first semiconductor portion 11a. In the example, the first connection electrode 51 further includes a third metal unit 51c. The third metal unit 51c is provided between the first metal unit 51a and the first semiconductor portion 11a. The third metal unit 51c is, for example, the n-side electrode of the first light emitting unit 10u. The second metal unit 51b is, for example, the n-side electrode of the second light emitting unit 20u.

The third metal unit 51c includes a material having ohmic properties with the first semiconductor layer 11 and a low contact resistance. The second metal unit 51b may include, for example, a material having ohmic properties with the third semiconductor layer 23 and a low contact resistance. The second metal unit 51b may be, for example, connected with the first inter-layer portion 41t with good adhesion. For example, the third metal unit 51c and the second metal unit 51b may include a metal film including at least one selected from the group consisting of Al, Ti, Cu, Ag, and Ta. An alloy including the at least one selected from the group may be used. A stacked film including multiple metal films of the at least one selected from the group may be used.

The first metal unit 51a can electrically connect the second metal unit 51b and the third metal unit 51c. For example, the first metal unit 51a may include a metal film including at least one selected from the group consisting of Al, Ti, Cu, Ag, Au, W, and Ni. An alloy including the at least one selected from the group may be used. A stacked film including multiple metal films of the at least one selected from the group may be used.

The first dielectric layer 51i is provided between the first connection electrode 51 and the second semiconductor layer 12 and between the first connection electrode 51 and the first light emitting layer 10L. The first dielectric layer 51i includes, for example, at least one selected from metal oxide, metal nitride, and metal oxynitride. The first dielectric layer 51i includes, for example, silicon oxide.

The first pad 41p is electrically connected with the third semiconductor layer 23. For example, in the example, the first pad 41p is electrically connected with the first pad disposition portion 41u of the first conductive layer 41. In the example, the first conductive layer 41 is disposed between the first pad 41p and the second light emitting unit 20u. For example, the first conductive layer 41 is provided on the second light emitting unit 20u; and the first pad 41p is provided on the first conductive layer 41 (on the first pad disposition portion 41u).

The first semiconductor portion 11a (i.e., the first semiconductor layer 11) is electrically connected with the first pad 41p via the first connection electrode 51 and the first conductive layer 41. The third semiconductor layer 23 is electrically connected with the first pad 41p via the first conductive layer 41. The first pad 41p is, for example, a pad for the first conductivity type (and the third conductivity type). For example, the first pad 41p is used as an n-side pad.

The second conductive layer 42 includes a second inter-layer portion 42t and a second pad disposition portion 42u. The second inter-layer portion 42t is provided between the first light emitting unit 10u and the second light emitting unit 20u. The second pad disposition portion 42u is arranged with the second inter-layer portion 42t in a direction crossing the first direction D1. The second conductive layer 42 is electrically connected with the second semiconductor layer 12.

The second pad 42p is electrically connected with the second semiconductor layer 12. In the example, the second pad 42p is electrically connected with the second pad disposition portion 42u. The second conductive layer 42 is disposed between the second pad 42p and the second light emitting unit 20u. In the example, the second conductive layer 42 is provided on the second light emitting unit 20u; and the second pad 42p is provided on a portion (the second pad disposition portion 42u) of the second conductive layer 42.

The second semiconductor layer 12 is electrically connected with the second pad 42p via the second conductive layer 42. The second pad 42p is used as a pad for the second conductivity type. The second pad 42p is used as, for example, a p-side pad of the first light emitting unit 10u.

The first inter-light emitting unit dielectric layer 71 is provided between the first light emitting unit 10u and the second light emitting unit 20u. In the example, the first inter-light emitting unit dielectric layer 71 is further provided between the second conductive layer 42 and the second light emitting unit 20u. The first inter-light emitting unit dielectric layer 71 is further provided between the first light emitting unit 10u and the first conductive layer 41. The first inter-light emitting unit dielectric layer 71 is further provided between the first conductive layer 41 and the second conductive layer 42. The first inter-light emitting unit dielectric layer 71 is light-transmissive. The optical transmittance of the first inter-light emitting unit dielectric layer 71 is higher than the optical transmittance of the first electrode 61. The optical reflectance of the first electrode 61 is higher than the optical reflectance of the first inter-light emitting unit dielectric layer 71.

The first inter-light emitting unit dielectric layer 71 includes, for example, at least one selected from metal oxide, metal nitride, and metal oxynitride. The first inter-light emitting unit dielectric layer 71 includes, for example, silicon oxide.

In the example, the second conductive layer 42 includes a first light-transmissive conductive unit 42a and a first interconnect unit 42b. The first light-transmissive conductive unit 42a is provided between the first light emitting unit 10u and the first inter-light emitting unit dielectric layer 71. The first light-transmissive conductive unit 42a is electrically connected with the second semiconductor layer 12.

The first light-transmissive conductive unit 42a includes, for example, an oxide including at least one element selected from the group consisting of In, Sn, Zn, and Ti. The first light-transmissive conductive unit 42a includes, for example, ITO, etc. The first light-transmissive conductive unit 42a may include a thin film of a metal.

The first interconnect unit 42b is provided between, for example, the first light-transmissive conductive unit 42a and the first inter-light emitting unit dielectric layer 71. The first interconnect unit 42b is electrically connected with the first light-transmissive conductive unit 42a. The optical transmittance of the first interconnect unit 42b is lower than the optical transmittance of the first light-transmissive conductive unit 42a. A metal having a low resistivity is suited to the first interconnect unit 42b. The first interconnect unit 42b includes, for example, a metal film including at least one selected from the group consisting of Al, Au, Ag, and Cu, an alloy including the at least one selected from the group, or a stacked film including multiple films of the at least one selected from the group.

In the example, at least a portion of the first light-transmissive conductive unit 42a is disposed between the second pad 42p and the second light emitting unit 20u. In other words, the second pad 42p is disposed on the first light-transmissive conductive unit 42a. As described below, the second pad 42p is provided on the first interconnect unit 42b.

A support layer 66c and a second electrode 62 are further provided in the example. The first electrode 61 is disposed between the second light emitting unit 20u and the second electrode 62. The support layer 66c is disposed between the first electrode 61 and the second electrode 62. In the example, the support layer 66c is conductive. The second electrode 62 is electrically connected with the first electrode 61. The support layer 66c includes, for example, a Si substrate, etc. A metal substrate may be used as the support layer 66c. For example, a metal layer (e.g., a plating metal layer), etc., may be used as the support layer 66c. A composite of a combination of a resin and a metal may be used as the support layer 66c. A composite of a combination of a resin and a ceramic may be used as the support layer 66c.

A support layer-side dielectric layer 78 is further provided in the example. The support layer-side dielectric layer 78 is provided along an outer edge 20Lr of the second light emitting unit 20u between at least a portion of the support layer 66c and at least a portion of the second light emitting unit 20u. The support layer-side dielectric layer 78 includes, for example, at least one selected from metal oxide, metal nitride, and metal oxynitride. The support layer-side dielectric layer 78 includes, for example, silicon oxide.

For example, a current is supplied to the second light emitting layer 20L of the second light emitting unit 20u via the first electrode 61 by applying a voltage between the second electrode 62 and the first pad 41p. Thereby, the second light is emitted from the second light emitting layer 20L. The second light is emitted to the outside by passing through the first inter-light emitting unit dielectric layer 71 and the first light emitting unit 10u.

For example, a current is supplied to the first light emitting layer 10L of the first light emitting unit 10u by applying a voltage between the second pad 42p and the first pad 41p. Thereby, the first light is emitted from the first light emitting layer 10L. The first light is emitted to the outside from the first semiconductor layer 11 side.

In the semiconductor light emitting element 110, the light is emitted to the outside by passing through the first light emitting unit 10u. For example, the first light emitting unit 10u has a surface 11u. The surface 11u is a surface on the side opposite to the second light emitting unit 20u. The surface 11u is, for example, the upper surface. The surface 11u is used as a surface on the light extraction side of the semiconductor light emitting element 110.

As illustrated in FIG. 1A to FIG. 1C, a light-transmissive conductive layer 11el may be provided on the surface 11u. The first semiconductor layer 11 is disposed between the conductive layer 11el and the first light emitting layer 10L. The conductive layer 11el is used as, for example, the n-side electrode of the first light emitting unit 10u. By providing the conductive layer 11el, the current spreading of the first semiconductor layer 11 of the first light emitting unit 10u is increased. Thereby, the operating voltage decreases; and the luminous efficiency increases. When projected onto the X-Y plane, at least a portion of the conductive layer 11el may overlap at least a portion of at least one selected from the first conductive layer 41 and the first interconnect unit 42b. Thereby, color breakup is suppressed; and the absorption of the emitted light by the conductive layer 11el is suppressed. Thereby, uneven color can be reduced; and the light extraction efficiency can be increased. The conductive layer 11el may be light-transmissive. The conductive layer 11el may be provided as necessary and may be omitted.

As shown in FIG. 1A, the first pad 41p is separated from the second pad 42p. For example, when projected onto a plane (the X-Y plane) perpendicular to the first direction D1, the first pad 41p does not overlap the second pad 42p.

In the semiconductor light emitting element 110 according to the embodiment, the first pad 41p is used as both the n-side pad of the first light emitting unit 10u and the n-side pad of the second light emitting unit 20u. The first pad 41p is shared by the two light emitting units. In the semiconductor light emitting element 110, there are few interconnects that have low optical transmittance. Thereby, a high light extraction efficiency is obtained. According to the semiconductor light emitting element 110, a stacked semiconductor light emitting element having a high efficiency can be provided.

For example, in a stacked semiconductor light emitting element (e.g., a multicolor light emission LED) in which the light emission is controllable independently, current is injected independently to each of the multiple light emitting layers (e.g., the multiple LED chips). For example, two electrodes of the n-side electrode and the p-side electrode are provided in one LED. Therefore, in the stacked LED, the number of conduction paths (e.g., pads, bumps, etc.) increases proportionally to twice the number of stacks. As the conduction paths increase, the surface area of the light emitting region decreases; and the efficiency decreases. Further, the assembly processes become complex.

In the stacked semiconductor light emitting element of the embodiment, the number of conduction paths (e.g., pads, bumps, etc.) can be reduced.

In the embodiment, the first pad 41p is, for example, a common n-side pad. The second pad 42p is, for example, the p-side pad of the light emitting unit of the upper side. The first connection electrode 51 is the n-side electrode of the light emitting unit of the upper side and is a connection electrode. The first light-transmissive conductive unit 42a of the second conductive layer 42 is, for example, the p-side electrode of the light emitting unit of the upper side. The first interconnect unit 42b of the second conductive layer 42 is, for example, an interconnect electrode of the light emitting unit of the upper side. The first conductive layer 41 functions as, for example, the n-side electrode of the light emitting unit of the lower side, the interconnect electrode of the light emitting unit of the lower side, and the interconnect electrode of the light emitting unit of the upper side. Multiple first connection electrodes 51 may be provided. In such a case, for example, because the current spreading increases, the operating voltage decreases; and the luminous efficiency increases.

In the embodiment, a transparent bonding member (e.g., the first inter-light emitting unit dielectric layer 71) is provided between multiple light emitting units (e.g., the LED chips). Then, the light emitting unit (e.g., the first light emitting unit 10u) of the upper side has a laterally conducting structure. The n-side electrode (e.g., the first connection electrode 51) of the light emitting unit of the upper side pierces the transparent bonding member to be electrically connected with the n-type semiconductor layer (the third semiconductor layer 23) of the light emitting unit (the second light emitting unit 20u) of the lower side. In the embodiment, a dielectric (the first inter-light emitting unit dielectric layer 71) is provided between the light emitting unit of the upper side and the light emitting unit of the lower side. The n-side electrode of the light emitting unit of the upper side pierces the dielectric to be electrically connected with the n-type semiconductor of the light emitting unit of the lower side.

Thereby, the number of conduction paths (the first electrode 61, the first pad 41p, and the second pad 42p) is three when the number of stacks is two. In other words, the number of conduction paths decreases. Thereby, the light emitting region widens; and high efficiency is obtained. Further, the assembly processes are simplified. According to the embodiment, the light extraction efficiency increases. Further, the interconnect resistance can be reduced; and the operating voltage decreases. The cost can be reduced. The yield can be increased.

In the embodiment, for example, the current is supplied to the n-side electrode of the light emitting unit (e.g., the first light emitting unit 10u) of the upper side from the n-side pad of the light emitting unit (the second light emitting unit 20u) of the lower side. The n-side electrode (e.g., the first conductive layer 41) and the n-type semiconductor layer (the third semiconductor layer 23) of the light emitting unit (the second light emitting unit 20u) of the lower side function as the current spreading layers of the light emitting unit (the first light emitting unit 10u) of the upper side. Thereby, the luminous efficiency can be increased. Also, the number of interconnects can be reduced.

FIG. 2A to FIG. 2D are schematic views illustrating the semiconductor light emitting element according to the first embodiment.

Figure 2A:
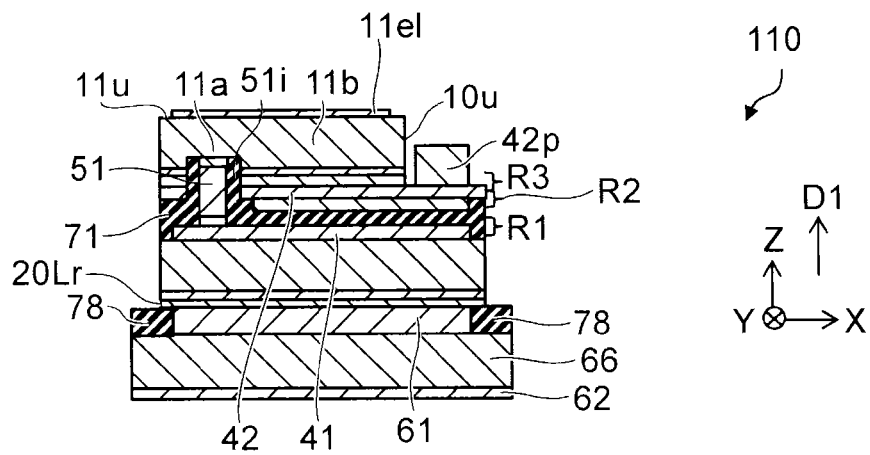
FIG. 2A to FIG. 2D are schematic views showing the semiconductor light emitting element according to the first embodiment.
Figure 2B:
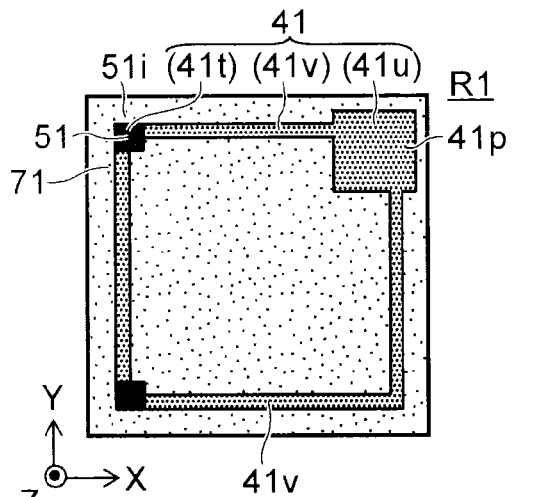
Figure 2C:
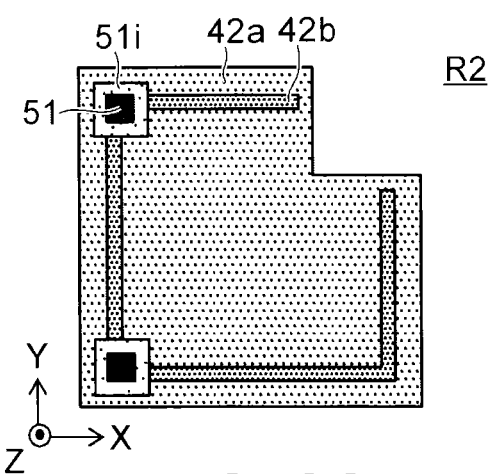
Figure 2D:
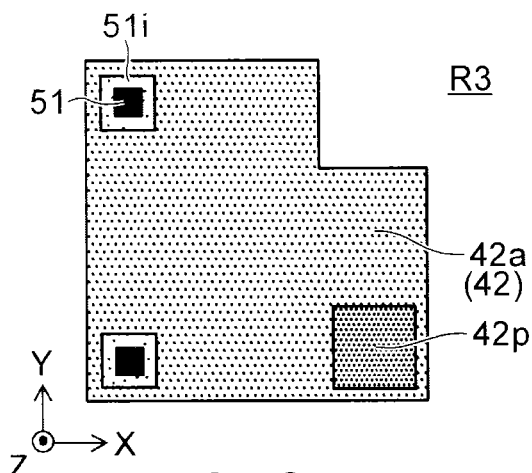

FIG. 2A is a cross-sectional view of the same cross section as FIG. 1C. FIG. 2B to FIG. 2D are schematic see-through plan views corresponding to regions R1 to R3 shown in FIG. 2A. The regions R1 to R3 are regions parallel to the X-Y plane. The region R1 is the region including the first pad 41p and the first conductive layer 41. The region R2 is the region including the first light-transmissive conductive unit 42a and the first interconnect unit 42b. The region R3 is the region including the second pad 42p and the first light-transmissive conductive unit 42a.

As shown in FIG. 2B, the semiconductor light emitting element 110 has a substantially rectangular planar configuration. In the example, the first conductive layer 41 is provided along the sides of the rectangle in the region R1. The first connection electrode 51 and the first pad 41p are connected by the first conductive layer 41. The portion around the first connection electrode 51 is used as the first dielectric layer 51i. The remaining portion is used as the first inter-light emitting unit dielectric layer 71.

As shown in FIG. 2C, the first light-transmissive conductive unit 42a and the first interconnect unit 42b are provided in the region R2. The first light-transmissive conductive unit 42a and the first interconnect unit 42b are electrically connected with each other. The first dielectric layer 51i is provided between the first connection electrode 51 and the first light-transmissive conductive unit 42a and between the first connection electrode 51 and the first interconnect unit 42b. These conductive units are insulated from each other.

As shown in FIG. 2B and FIG. 2C, at least a portion of the first conductive layer 41 and at least a portion of the first interconnect unit 42b overlap each other when projected onto the X-Y plane. For example, when projected onto the X-Y plane, at least a portion of the first extension portion 41v of the first conductive layer 41 and at least a portion of the first interconnect unit 42b overlap each other.

As shown in FIG. 2D, the first light-transmissive conductive unit 42a and the second pad 42p are provided in the region R3. The first light-transmissive conductive unit 42a and the second pad 42p are electrically connected with each other. The first dielectric layer 51i is provided between the first connection electrode 51 and the first light-transmissive conductive unit 42a. These conductive units are insulated from each other.

According to the semiconductor light emitting element 110, a stacked semiconductor light emitting element having a high efficiency can be provided. In the semiconductor light emitting element 110, various modifications of the pattern arrangements of the components are possible.

An example of a method for manufacturing the semiconductor light emitting element 110 will now be described.

FIG. 3A to FIG. 3C are schematic views illustrating the method for manufacturing the semiconductor light emitting element according to the first embodiment.

First, an example of the method for making the second light emitting unit 20u will be described.

The third semiconductor layer 23, the second light emitting layer 20L, and the fourth semiconductor layer 24 are formed in this order by MOCVD on a growth substrate (e.g., a sapphire substrate, a Si substrate, etc.). A stacked body (a crystal layer) that includes these semiconductor layers is formed. The crystal layer is a portion of a semiconductor wafer. At this time, a buffer layer may be formed on the growth substrate; and the third semiconductor layer 23 may be formed on the buffer layer. The material and plane orientation of the growth substrate are arbitrary.

For example, a $SiO_2$ film is formed on the crystal layer (i.e., on the fourth semiconductor layer 24). The thickness of the $SiO_2$ film is, for example, 400 nanometers (nm).

For example, a Ag layer is formed on the fourth semiconductor layer 24 by lift-off. The thickness of the Ag layer is, for example, 200 nm. For example, heat treatment is performed. For example, the conditions of the heat treatment are between 300° C. and 800° C. in oxygen. The Ag layer is used as at least a portion of the first electrode 61.

A metal layer is formed on the entire fourth semiconductor layer 24 and the Ag layer. The metal layer includes a barrier metal and a metal film for solder bonding. For example, the layers of TiW 50 nm/Pt 100 nm/TiW 50 nm/Pt 100 nm/Ti 100 nm/Au 50 nm are formed. The metal layer may be included in the first electrode 61 for convenience.

The support layer 66c is prepared. The support layer 66c includes, for example, a Si substrate. A solder layer of, for example, Au—Sn is provided on the surface of the Si substrate. The thickness of the solder layer is, for example, about 2000 nm. The solder layer and the first electrode 61 (e.g., the metal layer recited above) are bonded by causing the solder layer and the semiconductor wafer recited above to oppose each other. For example, the bonding is performed at a temperature of about 280° C.

The growth substrate is removed. For example, in the case where a sapphire substrate is used as the growth substrate, for example, LLO (Laser Lift Off) is used. In the case where a Si substrate is used as the growth substrate, at least one selected from polishing, dry etching, and wet etching is used.

The buffer layer recited above is exposed by removing the growth substrate. The third semiconductor layer 23 is exposed by removing the exposed buffer layer.

The first conductive layer 41 (the interconnect electrode) is formed on the surface of the exposed third semiconductor layer 23. In such a case, for example, lift-off is used. For example, a stacked film (having a total thickness of 500 nm) of Al/Ni/Au is formed as the first conductive layer 41.

The first conductive layer 41 includes a pad region (the first pad disposition portion 41u) where the pad is subsequently formed, an interconnect electrode (the first extension portion 41v) for spreading the current, and a connection region (the first inter-layer portion 41t) where the first connection electrode 51 is subsequently formed.

The configuration of the pad region (the first pad disposition portion 41u) is, for example, a rectangle, an ellipse, a fan-like configuration, or a combination of such shapes. The size (the length in a direction perpendicular to the Z-axis direction) of the pad region is, for example, not more than 100 µm. The line width of the first conductive layer 41 (the width of the first extension portion 41v) is, for example, 10 µm (e.g., not less than 5 µm and not more than 50 µm).

A portion of the first conductive layer 41 may be provided as necessary and may be omitted. For example, in the case where the chip size is small, the first extension portion 41v of the first conductive layer 41 may not be provided. In such a case, the first inter-layer portion 41t (the portion directly under the first connection electrode 51 described below) of the first conductive layer 41 and the first pad disposition portion 41u (the pad region) of the first conductive layer 41 are provided.

It is favorable for the thickness of the first conductive layer 41 to be, for example, not less than 10 nm and not more than 10000 nm. It is more favorable for the thickness of the first conductive layer 41 to be, for example, not less than 50 nm and not more than 1000 nm.

In the case where the thickness of the first conductive layer 41 is thin, the difference in levels when planarizing in the CMP process described below becomes small. Thereby, the necessary polishing amount decreases. The thickness of the first inter-light emitting unit dielectric layer 71 described below can be thinner; and the film formation time and the CMP processing time can be reduced. Thereby, for example, the cost decreases. In the case where the thickness of the first conductive layer 41 is thick, the interconnect resistance of the first conductive layer 41 (the first extension portion 41v) decreases; and the spread of the current is easy. Thereby, the effective light emitting region increases; the luminous efficiency increases; and the operating voltage decreases.

A Cu layer that is used to form an electrode (the second metal unit 51b) for connecting is formed by lift-off in the region including the top of the first inter-layer portion 41t. The thickness of the Cu layer is, for example, 200 nm.

The configuration of the second metal unit 51b is, for example, a rectangle, a polygon, an ellipse (including a circle), a fan-like configuration, or a combination of these shapes. It is favorable for the thickness of the second metal unit 51b to be, for example, not less than 10 nm and not more than 10000 nm. It is more favorable for the thickness of the second metal unit 51b to be not less than 50 nm and not more than 500 nm. The second metal unit 51b is designed such that the second metal unit 51b can be exposed in the CMP process described below. It is favorable for the size (the length in a direction perpendicular to the Z-axis direction) of the second metal unit 51b to be not less than 1 µM and not more than 100 µm. It is more favorable for the size of the second metal unit 51b to be not less than 5 µm and not more than 20 µm.

In the case where the second metal unit 51b is small, the light extraction efficiency increases because the effective cross-sectional area for the emitted light decreases. In the case where the second metal unit 51b is large, the requirements on the alignment precision in the bonding process described below can be relaxed; and the current density when a large current flows can be suppressed to be low. Thereby, for example, the yield increases; the cost decreases; and the life is longer.

The second metal unit 51b may include, for example, a film of one selected from Al, Ag, Ni, Cu, W, Ti, and Au or a stacked film including at least one of the films.

The second metal unit 51b may include a metal having a low resistivity. Thereby, a large current is caused to flow. The second metal unit 51b may include a metal having a high reflectance to the emitted light. Thereby, the light extraction efficiency increases. The number of the second metal units 51b is, for example, the same as the number of the connection electrodes (the first metal units 51a) of the first light emitting unit 10u described below. The position of the second metal unit 51b in the X-Y plane overlaps the position of the first metal unit 51a in the X-Y plane.

A light-transmissive insulating layer is formed to cover the second metal unit 51b and the first conductive layer 41. The insulating layer is used to form a portion of the first inter-light emitting unit dielectric layer 71. The insulating layer is, for example, a $SiO_2$ film. The thickness of the $SiO_2$ film is, for example, not less than 100 nm and not more than 10000 nm. The $SiO_2$ film is formed by, for example, ECR sputtering or plasma CVD. Thereby, for example, high-quality film properties are obtained at a low temperature. For example, in the case where plasma CVD is used, the occurrence of voids in structures having a large difference in levels can be suppressed because the coverage is good.

The connection electrode (the second metal unit 51b) recited above may be formed after the light-transmissive insulating layer (the $SiO_2$ film) is formed. The method for forming the connection electrode (the second metal unit 51b) may be, for example, lift-off combined with vapor deposition, sputtering, CVD, plating, or a combination of these methods.

Planarizing is performed by CMP processing. Thereby, the second metal unit 51b is exposed. In the case where the difference in levels is large, the $SiO_2$ film recited above is set to be thick due to the planarizing by CMP processing. The thickness of the $SiO_2$ film is set to be not less than three times the thickness of the difference in levels.

For example, a pseudo-flat state may be made prior to the CMP processing by reducing the difference in levels of the $SiO_2$ film by dry etching, etc. Thereby, the polishing amount (thickness) necessary in the planarizing can be reduced.

A slurry for which the etching rates of the second metal unit 51b and the $SiO_2$ film are adjusted may be used. Thereby, for example, the second metal unit 51b and the $SiO_2$ film can be planarized simultaneously in the CMP processing.

Thus, the structural body (the second stacked body 20us, i.e., the second semiconductor wafer 20uw) illustrated in FIG. 3A is formed. The structural body includes the second light emitting unit 20u. For example, a $SiO_2$ film (a second dielectric film 71b) and the second metal unit 51b recited above are provided on the upper surface of the structural body.

The second metal unit 51b may be caused to slightly protrude by polishing slightly using a slurry having a high etching rate for the material of the first conductive layer 41 after the CMP processing recited above. Similar processing also may be performed for the first metal unit 51a of the first light emitting unit 10u described below. Thereby, the protruding second metal unit 51b and the protruding first metal unit 51a are bonded to contact each other. Because the metals have ductility, the metals are mashed when subjected to the compressive stress; and the second metal unit 51b and the first metal unit 51a can be connected with high yield while bonding the two $SiO_2$ films.

The method for connecting the second metal unit 51b and the first metal unit 51a may include methods utilizing the high coefficient of thermal expansion of the metals. In other words, these metal units are bonded after the CMP processing; and heat treatment at about 350° C. is performed. Thereby, thermal expansion of the second metal unit 51b and the first metal unit 51a occurs; and more reliable conduction is obtained.

An example of a method for making the first light emitting unit 10u will now be described.

The first semiconductor layer 11, the first light emitting layer 10L, and the second semiconductor layer 12 are formed in this order by, for example, MOCVD on a growth substrate (a growth substrate 10s illustrated in FIG. 3B). In FIG. 3A, up and down in the drawing are shown as being reversed from up and down when forming the semiconductor layers. A stacked body (a crystal layer) that includes these semiconductor layers is formed. The crystal layer is a portion of a semiconductor wafer. At this time, a buffer layer may be formed on the growth substrate; and the first semiconductor layer 11 may be formed on the buffer layer. The growth substrate 10s includes, for example, a sapphire substrate, a Si substrate, etc. The material and plane orientation of the growth substrate 10s are arbitrary.

The first peak wavelength of the first light emitted from the first light emitting layer 10L may be longer than or shorter than the second peak wavelength of the second light emitted from the second light emitting layer 20L. In the case where the first peak wavelength is longer than the second peak wavelength, the absorption of the light by the first light emitting layer 10L is suppressed. Thereby, a high light extraction efficiency is obtained.

A light-transmissive electrode (e.g., ITO) that is used to form the first light-transmissive conductive unit 42a is formed on the crystal layer of the first light emitting unit 10u (on the second semiconductor layer 12). The thickness of the light-transmissive electrode is, for example, 400 nm (e.g., not less than 100 nm and not more than 800 nm). For example, heat treatment is performed at 700° C. in nitrogen. Thereby, the first light-transmissive conductive unit 42a is formed.

A stacked film of Ti/Pt/Au that is used to form the first interconnect unit 42b is formed by, for example, lift-off on the first light-transmissive conductive unit 42a. The total thickness of the stacked film is, for example, 500 nm (e.g., not less than 200 nm and not more than 800 nm). The first interconnect unit 42b is used to form the interconnect electrode of the first light emitting unit 10u for the second semiconductor layer 12.

The resistivity of the first light-transmissive conductive unit 42a is relatively high. By providing the first interconnect unit 42b, the current spreading properties can be improved. Thereby, the current can be spread in a wide region of the second semiconductor layer 12. The line width of the first interconnect unit 42b is, for example, 10 μm (e.g., not less than 5 μm and not more than 30 μm). In the case where the chip size is small, the first interconnect unit 42b may not be provided.

It is favorable for the thickness of the first interconnect unit 42b to be, for example, not less than 10 nm and not more than 10000 nm. It is more favorable for the thickness of the first interconnect unit 42b to be not less than 50 nm and not more than 1000 nm. In the case where the thickness of the first interconnect unit 42b is thin, the difference in levels is small and the necessary polishing amount is low when planarizing in the CMP process described below. Thereby, the thickness of the first inter-light emitting unit dielectric layer 71 described below can be thin. The processing time of the CMP processing can be reduced. Thereby, the cost can be reduced. In the case where the thickness of the first interconnect unit 42b is thick, the interconnect resistance of the first interconnect unit 42b can be reduced; and the current spreading increases. Thereby, the effective light emitting region increases; the luminous efficiency increases; and the operating voltage decreases.

For example, a portion of the first light-transmissive conductive unit 42a, the second semiconductor layer 12, and the first light emitting layer 10L is removed by dry etching. The first semiconductor layer 11 is exposed at the removed portion. The exposed portion is used as the first semiconductor portion 11a. The depth of the hole made by the removal is, for example, 1000 nm (e.g., not less than 600 nm not more than 1500 nm). The wall surface of the hole may be perpendicular (perpendicular to the X-Y plane). The wall surface of the hole may have a tapered configuration. In the case of being perpendicular, the surface area occupied by the hole can be small; and the light emission surface area can be increased. In the case of the tapered configuration, the coverage of the insulating unit described below improves.

It is favorable for the width (the length in a direction perpendicular to the Z-axis direction) of the hole to be, for example, not less than 1 μM and not more than 100 μm. It is more favorable for the width of the hole to be, for example, not less than 5 μm and not more than 20 μm. In the case where the width of the hole is narrow, the surface area of the first light emitting layer 10L can be increased. Thereby, the light emitting region can be enlarged; the luminous efficiency increases; and the operating voltage can be reduced. In the case where the width of the hole is wide, the size of the connection electrode (the first connection electrode 51) described below can be large.

In the case where the number of holes is low, the surface area of the first light emitting layer 10L can be increased. Thereby, the light emitting region can be enlarged. In the case where the number of holes is high, multiple n-side electrodes (e.g., the first metal units 51a) described below can be disposed over the entire element. Thereby, the current can be injected uniformly into the first light emitting layer 10L. Thereby, the luminous efficiency increases; and the operating voltage decreases. The emitted light that is wave-guided through the crystal layer of the first light emitting unit 10u can be scattered or reflected at the holes. Thereby, the probability of extracting, to the outside, the emitted light that is trapped inside the crystal layer increases. Thereby, the light extraction efficiency increases.

For example, a $SiO_2$ film is formed as a dielectric layer over the entire first light-transmissive conductive unit 42a, the first interconnect unit 42b, and the exposed crystal layer. The thickness of the $SiO_2$ film is, for example, about 400 nm (e.g., not less than 200 nm and not more than 800 nm). The $SiO_2$ film that is provided on the side surface of the hole is used as an insulating unit that insulates the second semiconductor layer 12 from the first semiconductor layer 11. In other words, the $SiO_2$ film that is provided on the side surface of the hole is used to form at least a portion of the first dielectric layer 51i. The $SiO_2$ film that is formed on the bottom of the hole is removed subsequently. The remaining region of the $SiO_2$ film is used to form a portion of the first inter-light emitting unit dielectric layer 71.

The $SiO_2$ film that is formed on the bottom of the hole is removed to expose the first semiconductor layer 11 at the bottom of the hole. A stacked film of Al/Ti that is used to form the third metal unit 51c (the n-side electrode) is formed on the exposed first semiconductor layer 11. The thickness of the stacked film is, for example, about 200 nm (e.g., not less than 100 nm and not more than 400 nm). It is favorable for the thickness of the third metal unit 51c to be not less than 10 nm and not more than 10000 nm. It is more favorable for the thickness of the third metal unit 51c to be not less than 50 nm and not more than 1000 nm. The third metal unit 51c has an ohmic contact with the first semiconductor layer 11. The third metal unit 51c may be a single-layer film or may be a stacked film of different multiple metal films.

For example, an Al film is formed to fill the hole. The Al film is used to form a portion of the first connection electrode 51. The Al film is used to form a connection electrode (the first metal unit 51a) on the first light emitting unit 10u side. The connection electrode may be formed by, for example, lift-off combined with vapor deposition, sputtering, CVD, plating, or a combination of these methods. For example, a Cu layer may be formed as the connection electrode by electroless plating. In such a case, for example, a Cu film or a Au film may be formed inside the hole as a seed layer. Seed layer enhancement may be performed for the seed layer of the plating. In other words, for example, a W film may be formed by, for example, CVD.

The connection electrode (the first metal unit 51a) also may be used as the third metal unit 51c (the n-side electrode of the first light emitting unit 10u). In other words, the third metal unit 51c may be omitted. The shape, number, and size of the connection electrode (the first metal unit 51a) on the first light emitting unit 10u side correspond to the shape, number, and size of the connection electrode (the second metal unit 51b) on the second light emitting unit 20u side.

The connection electrode (the first metal unit 51a) includes, for example, a film of at least one selected from Cu, Ag, Ni, Ti, W, and Au or a stacked film of multiple films including at least one selected from these films. A metal having a low resistivity may be used as the connection electrode (the first metal unit 51a). Thereby, a large current can be caused to flow. A metal having a high reflectance to the emitted light may be used as the connection electrode (the first metal unit 51a). Thereby, the light extraction efficiency can be increased.

A light-transmissive insulating layer (e.g., a $SiO_2$ film) is formed to cover the connection electrode (the first metal unit 51a). The insulating layer (the $SiO_2$ film) is used to form, for example, another portion of the first inter-light emitting unit dielectric layer 71. The thickness of the insulating layer is, for example, not less than 100 nm and not more than 10000 nm. The insulating layer may be formed by, for example, ECR sputtering or plasma CVD. Thereby, for example, high-quality film properties are obtained at a low temperature. For example, because a film formed by plasma CVD has good coverage, the occurrence of voids in structures having a large difference in levels can be suppressed.

The connection electrode (the first metal unit 51a) recited above may be formed after the light-transmissive insulating layer recited above is formed. The connection electrode (the first metal unit 51a) is formed by, for example, lift-off combined with vapor deposition, sputtering, CVD, plating, or a combination of these methods.

The light-transmissive insulating layer (e.g., the $SiO_2$ film) is planarized by CMP processing. Thereby, the connection electrode (the first metal unit 51a) is exposed. In the case where the difference in levels is large, the thickness of the $SiO_2$ film is set to be thick because of the planarizing by CMP processing. The thickness of the $SiO_2$ film is set to be, for example, not less than three times the difference in levels. A pseudo-flat state may be made by reducing the difference in levels of the $SiO_2$ film by dry etching, etc., prior to the CMP processing. Thereby, the polishing amount (the thickness) necessary in the planarizing can be small.

Thereby, the structural body (the first stacked body 10us, i.e., the first semiconductor wafer 10uw) illustrated in FIG. 3B is formed. The structural body includes the first light emitting unit 10u. For example, the $SiO_2$ film (a first dielectric film 71a) and the first metal unit 51a recited above are provided on the surface (the lower surface) of the structural body.

The first stacked body 10us and the second stacked body 20us recited above are connected, for example, as follows.

The $SiO_2$ film (the first dielectric film 71a) of the first stacked body 10us and the $SiO_2$ film (the second dielectric film 71b) of the second stacked body 20us that have been subjected to the CMP processing are bonded by, for example, direct bonding. For example, plasma cleaning using an oxygen atmosphere is performed in a vacuum.

As shown in FIG. 3C, the $SiO_2$ film (the first dielectric film 71a) of the first semiconductor wafer 10uw of the first stacked body 10us and the $SiO_2$ film (the second dielectric film 71b) of the second semiconductor wafer 20uw of the second stacked body 20us are caused to oppose each other and are brought into contact. Then, for example, a pressure of 1 kN is applied at a temperature of 150° C. Thereby, the first semiconductor wafer 10uw of the first stacked body 10us and the second semiconductor wafer 20uw of the second stacked body 20us are bonded to each other. At this time, alignment is performed such that the first metal unit 51a and the second metal unit 51b are electrically connected.

The growth substrate 10s of the first light emitting unit 10u is removed. In the case where the growth substrate 10s is a sapphire substrate, LLO is used. In the case where the growth substrate 10s is a Si substrate, at least one selected from polishing, dry etching, and wet etching is used. Thereby, the crystal layer of the first light emitting unit 10u is exposed. For example, the buffer layer of the first light emitting unit 10u is exposed. The buffer layer is removed by dry etching. Thereby, the first semiconductor layer 11 is exposed.

Then, element separation is performed.

For example, a portion of the crystal layer of the first light emitting unit 10u is removed by dry etching. Thereby, the first light-transmissive conductive unit 42a is exposed.

Dry etching, wet etching, etc., is performed to remove a portion of the exposed first light-transmissive conductive unit 42a and remove a portion of the exposed first inter-light emitting unit dielectric layer 71. Thereby, a crystal layer (e.g., the third semiconductor layer 23) of the second light emitting unit 20u and a pad region (the first pad disposition portion 41u) of the n-side electrode (the first conductive layer 41) of the second light emitting unit 20u are exposed.

The $SiO_2$ film (the support layer-side dielectric layer 78) contacting the fourth semiconductor layer 24 is exposed by removing a portion of the exposed crystal layer of the second light emitting unit 20u by dry etching, wet etching, etc.

A not-shown insulating layer (e.g., a $SiO_2$ film) is formed on the entire surface of the support layer 66c on the light emitting unit side. The thickness of the insulating layer is, for example, about 400 nm (e.g., not less than 200 nm and not more than 800 nm). The insulating layer is formed by, for example, CVD. The insulating layer is used as a passivation film of the first light emitting unit 10u and the second light emitting unit 20u. The insulating layer covers the side surface of the first light emitting layer 10L and covers the side surface of the second light emitting layer 20L.

For example, a stacked film of Ti/Pt/Au is formed by, for example, spacer lift-off on the exposed pad region (the first pad disposition portion 41u of the first conductive layer 41) and on the exposed p-side electrode (the second pad disposition portion 42u of the second conductive layer 42). The thickness of the stacked film is, for example, about 500 nm (e.g., not less than 200 nm and not more than 800 nm). Thereby, the common n-side electrode pad (the first pad 41p) of the first light emitting unit 10u and the second light emitting unit 20u and the p-side electrode pad (the second pad 42p) of the first light emitting unit 10u are formed.

As described above, the first conductive layer 41 has a portion overlapping the first interconnect unit 42b when projected onto the X-Y plane. The first interconnect unit 42b has a portion overlapping the first conductive layer 41 when projected onto the X-Y plane. The light emitted from the light emitting layers is shielded by the first conductive layer 41 and the first interconnect unit 42b. The region where the emitted light is shielded can be small because at least a portion of the first conductive layer 41 and at least a portion of the first interconnect unit 42b overlap each other. Thereby, the light extraction efficiency increases. Further, uneven color can be reduced.

Subsequently, the second electrode 62 is formed. In other words, for example, the support layer 66c is polished; and the thickness of the support layer 66c is caused to be thin, e.g., about 150 µm. For example, a stacked film of Ti/Pt/Au that is used to form the second electrode 62 is formed on the polishing surface. The thickness of the stacked film is, for example, about 500 nm (e.g., not less than 200 nm and not more than 800 nm). Thereby, the second electrode 62 that is electrically connected with the first electrode 61 is formed.

The second electrode 62 may be formed on the first electrode 61. In such a case, for example, the first electrode 61 also may be exposed when exposing the support layer-side dielectric layer 78; and the second electrode 62 may be formed simultaneously on the first electrode 61 when forming the first pad 41p and the second pad 42p.

The second electrode 62 may be formed on the first electrode 61. In such a case, for example, a portion of the first electrode 61 also may be exposed when exposing the support layer-side dielectric layer 78; and the second electrode 62 may be formed simultaneously on the first electrode 61 when forming the first pad 41p and the second pad 42p.

Subsequently, singulation is performed by dicing, etc. Thereby, the semiconductor light emitting element 110 is formed.

According to the semiconductor light emitting element 110, a stacked semiconductor light emitting element having a high efficiency can be provided.

On the other hand, a reference example of a multicolor light emission LED may be considered in which multiple LED chips are stacked in an assembly process. In the reference example, a p-side interconnect and an n-side interconnect are provided for each of the LED chips. In the case where two LED chips are stacked, four interconnects are necessary. In the case where three LED chips are stacked, six interconnects are necessary. Therefore, the light extraction efficiency decreases due to the surface area of interconnects that do not contribute to the light extraction. Moreover, due to the complex assembly process, the yield is low; and the cost is high.

In the reference example, the light is extracted in different directions on the lower side and upper side in the case where the substrate (the growth substrate or the support substrate) or the electrode (in the case of a nitride semiconductor, the p-side electrode) covering substantially the entire surface of the LED chip disposed on the upper side is not light-transmissive for the light emitted from the LED chip disposed on the lower side (the package side). Therefore, color breakup occurs. Color breakup is, for example, a phenomenon in which the color of the emitted light changes with the viewing angle direction. Further, the light extraction efficiency of the LED chip disposed on the lower side markedly decreases because the major surface is covered with a substrate.

In the reference example, even in the case where the substrate is light-transmissive, it is necessary to expose the bonding pads. Therefore, it is necessary to stack LED chips having different chip sizes; and color breakup occurs. Moreover, it is necessary to use a wide alignment margin because the alignment precision in the assembly process is worse than the alignment precision in the photolithography process. Therefore, color breakup occurs more easily. Then, the light extraction efficiency decreases further. The yield decreases more easily.

Moreover, in the reference example, the thickness of the substrate normally is not less than 100 µm. Therefore, for the LED chip disposed on the upper side, the heat dissipation is poor; and the life is short. In the reference example, stacking is performed for each chip. Therefore, manufacturing takes time; and the cost increases.

In the semiconductor light emitting element 110 according to the embodiment, it is unnecessary to form an electrode on the surface on the light extraction side. Therefore, the light extraction efficiency is high. The interconnects can be omitted; and a high light extraction efficiency is obtained. Because a complex assembly process is not used, the yield is high; and the cost can be reduced. In the embodiment, color breakup can be suppressed. In the embodiment, because it is unnecessary to provide a substrate in the light emitting unit on the upper side, the heat dissipation is good; and a long life is obtained. In the embodiment, because multiple light emitting units are stacked in the wafer state, the manufacturing is simple; and the cost can be reduced.

FIG. 4 is a schematic cross-sectional view illustrating another semiconductor light emitting element according to the first embodiment.

FIG. 4 is a cross-sectional view corresponding to a line B1-B2 cross section of FIG. 1A.

In the semiconductor light emitting element 111 according to the embodiment as shown in FIG. 4, the planar configuration of the first light-transmissive conductive unit 42a is, for example, substantially the same as the planar configuration of the first light emitting unit 10u. Also, the second pad 42p is provided on the first interconnect unit 42b.

In other words, at least a portion of the first interconnect unit 42b is disposed between the second pad 42p and the second light emitting unit 20u.

In the semiconductor light emitting element 111 as well, a stacked semiconductor light emitting element having a high efficiency can be provided.

Figure 5A:
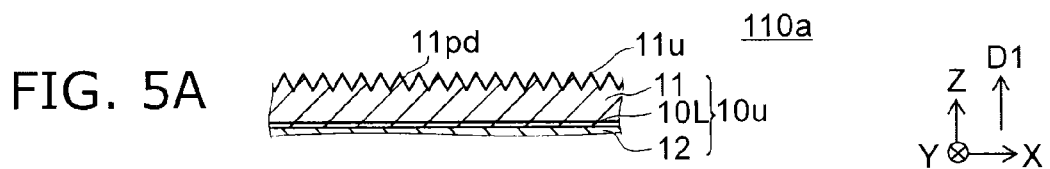
FIG. 5A and FIG. 5B are schematic cross-sectional views showing other semiconductor light emitting elements according to the first embodiment.
Figure 5B:
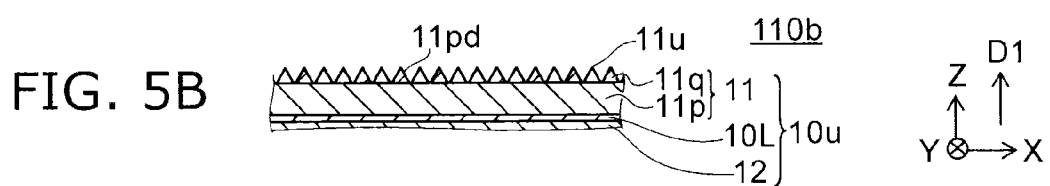

FIG. 5A and FIG. 5B are schematic cross-sectional views illustrating other semiconductor light emitting elements according to the first embodiment.

These drawings illustrate a portion of the first light emitting unit 10u.

As shown in FIG. 5A, the first light emitting unit 10u includes the surface 11u on the side opposite to the second light emitting unit 20u. The surface 11u is a surface on the light extraction side of the semiconductor light emitting element. In the semiconductor light emitting element 110a, an unevenness 11pd is provided in the surface 11u. In the example, the unevenness is provided in the surface of the first semiconductor layer 11.

In the semiconductor light emitting element 110b as shown in FIG. 5B, the first semiconductor layer 11 of the first light emitting unit 10u includes a high impurity concentration layer 11p and a low impurity concentration layer 11q having the first conductivity type. The high impurity concentration layer 11p is provided between the low impurity concentration layer 11q and the first light emitting layer 10L. The impurity concentration of the low impurity concentration layer 11q is lower than the impurity concentration of the high impurity concentration layer 11p. The high impurity concentration layer 11p is, for example, an n-type GaN layer. The low impurity concentration layer 11q is, for example, an undoped GaN layer. An AlGaN or AlN layer may be used as the low impurity concentration layer 11q. Even in the case where the low impurity concentration layer 11q is an undoped semiconductor layer, the low impurity concentration layer 11q is included in the first semiconductor layer 11 for convenience.

In the semiconductor light emitting element 110b, the surface 11u is the surface of the low impurity concentration layer 11q. In such a case as well, the unevenness 11pd is provided in the surface (the surface 11u) of the low impurity concentration layer 11q.

The light extraction efficiency can be increased by providing the unevenness 11pd in the surface (the surface 11u) on the light extraction side.

The first light-transmissive conductive unit 42a may include, for example, a light-transmissive electrode. The transmittance of the light-transmissive electrode for the emitted light is, for example, not less than 50%. The light-transmissive electrode is conductive. The light-transmissive electrode is formable having, for example, an ohmic contact with the n-type semiconductor layer. The light-transmissive electrode is formable having, for example, an ohmic contact with the p-type semiconductor layer. For example, at least one selected from ITO, ITON, and ZnO is used as the light-transmissive electrode. The thickness of the light-transmissive electrode is, for example, not less than 10 nm and not more than 10000 nm. A high transmittance is obtained when the thickness is thin. The current spreading properties improve when the thickness is thick because the sheet resistance decreases. For example, a thin metal may be used as the light-transmissive electrode. Oxides other than those recited above may be used as the light-transmissive electrode.

In the case where the thickness of the first inter-light emitting unit dielectric layer 71 (e.g., a $SiO_2$ film) for bonding is thin, the heat dissipation from the light emitting unit of the upper layer is good.

Uneven structures for light extraction may be formed in the surfaces of the n-type semiconductor layers (e.g., the first semiconductor layer 11 and the third semiconductor layer 23) in a state in which the n-type semiconductor layers are exposed.

The first electrode 61 may not be provided in the region overlapping the first pad 41p when projected onto the X-Y plane. The first electrode 61 may not be provided in the region overlapping the second pad 42p when projected onto the X-Y plane. The light that is emitted directly under the pad is easily absorbed by the pad. The light extraction efficiency can be increased by reducing the proportion that is absorbed.

The first electrode 61 may be provided only in the region overlapping the first light-transmissive conductive unit 42a when projected onto the X-Y plane. Thereby, the light emitting region of the first light emitting layer 10L and the light emitting region of the second light emitting layer 20L substantially match. Thereby, uneven color (color breakup) can be reduced. For example, the first electrode 61 may not be provided in the region overlapping the first interconnect unit 42b when projected onto the X-Y plane.

The first electrode 61 may not have an ohmic contact with the fourth semiconductor layer 24 in the region overlapping the first pad 41p and in the region overlapping the second pad 42p when projected onto the X-Y plane. The light that is emitted directly under the pad is easily absorbed by the pad. The light extraction efficiency can be increased by reducing the proportion that is absorbed.

The first electrode 61 may have an ohmic contact with the fourth semiconductor layer 24 only in the region overlapping the first light-transmissive conductive unit 42a when projected onto the X-Y plane. In other words, the first electrode 61 may not have an ohmic contact with the fourth semiconductor layer 24 in the region not overlapping the first light-transmissive conductive unit 42a when projected onto the X-Y plane. Thereby, the light emitting region of the first light emitting layer 10L and the light emitting region of the second light emitting layer 20L substantially match. Thereby, uneven color (color breakup) can be reduced.

In the case where the second pad 42p is formed on the first light-transmissive conductive unit 42a, the first light-transmissive conductive unit 42a (the ITO) can be used as an etching stop layer when performing dry etching of the crystal layer of the second light emitting unit 20u. If a metal layer is used as the etching stop layer, there are cases where by-products of the reaction with the dry etching gas or the metal removed by the etching adhere around the metal layer. Therefore, the structure may become nonuniform or leaks may occur. Also, the yield may decrease. Further, the life may shorten.

By using the ITO film of the first light-transmissive conductive unit 42a as the etching stop layer, the structure becomes uniform; and leaks are suppressed easily. The yield is increased easily; and the life can be longer.

In the case where the second pad 42p is formed on the first light-transmissive conductive unit 42a (the ITO), it is unnecessary to pattern the ITO film prior to the bonding. Therefore, the patterning is easy.

On the other hand, in the case where the second pad 42p is formed on the first interconnect unit 42b, the contact resistance between the second pad 42p and the first interconnect unit 42b can be low. Then, the adhesion between the second pad 42p and the first interconnect unit 42b is high. There are cases where the contact resistance between the ITO and the metal is relatively high and the adhesion is poor. By forming the second pad 42p on the first interconnect unit 42b, low contact resistance and good adhesion are obtained easily.

For the second light emitting unit 20u, for example, as recited above, Au—Sn solder is used to bond the first electrode 61 and the support layer 66c. For example, the bonding may be liquid phase diffusion bonding using solder of Au—In, Ni—Sn, etc. The bonding temperature is, for example, not less than 200° C. and not more than 250° C. Conversely, the melting point of the solder for the liquid phase diffusion bonding using the solder of Au—In, Ni—Sn, etc., can be high, i.e., not less than 400° C. and not more than 1100° C. Thereby, the temperature of the processes implemented after the bonding process using the solder can be lower than the temperature of the bonding process.

Figure 6:
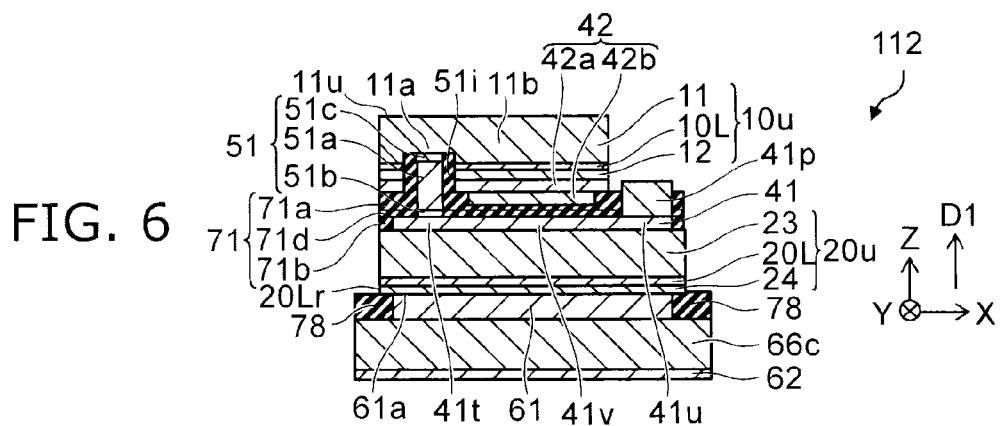
FIG. 6 is a schematic cross-sectional view showing another semiconductor light emitting element according to the first embodiment.

FIG. 6 is a schematic cross-sectional view illustrating another semiconductor light emitting element according to the first embodiment.

FIG. 6 is a cross-sectional view corresponding to a line A1-A2 cross section of FIG. 1A.

In the semiconductor light emitting element 112 according to the embodiment as shown in FIG. 6, a first optical layer 71d is provided in the first inter-light emitting unit dielectric layer 71 provided between the first light emitting unit 10u and the second light emitting unit 20u.

In the example, the first inter-light emitting unit dielectric layer 71 includes the first dielectric film 71a, the second dielectric film 71b, and the first optical layer 71d. The first dielectric film 71a is disposed between the first light emitting unit 10u and the second light emitting unit 20u. The second dielectric film 71b is disposed between the second light emitting unit 20u and the first dielectric film 71a. In the example, the first optical layer 71d is disposed between the first dielectric film 71a and the second dielectric film 71b.

The first optical layer 71d transmits the light (the second light) emitted from the second light emitting layer 20L and reflects the light (the first light) emitted from the first light emitting layer 10L. The first optical layer 71d is, for example, a dichromic mirror.

The transmittance of the first optical layer 71d for the second light is higher than the transmittance of the first optical layer 71d for the first light. The reflectance of the first optical layer 71d to the first light is higher than the reflectance of the first optical layer 71d to the second light.

For example, the first optical layer 71d may be provided between the first dielectric film 71a and the first light emitting unit 10u. At least a portion of the first optical layer 71d may contact the first light emitting unit 10u. For example, the first optical layer 71d may be provided between the second dielectric film 71b and the second light emitting unit 20u. At least a portion of the first optical layer 71d may contact the second light emitting unit 20u.

At least a portion of the first optical layer 71d may be formed by, for example, adjusting the thickness of the $SiO_2$ film (the second dielectric film 71b) of the lower layer for bonding. At least a portion of the first optical layer 71d may be formed by, for example, adjusting the thickness of the $SiO_2$ film (the first dielectric film 71a) of the upper layer for bonding.

The first optical layer 71d may include the same material as the first dielectric film 71a or a different material. The first optical layer 71d may include the same material as the second dielectric film 71b or a different material.

The first optical layer 71d may include any material transmissive to the second light. The first optical layer 71d has bonding strength and is insulative.

In the embodiment, for example, the first interconnect unit 42b and the first extension portion 41v of the first conductive layer 41 are used as the interconnect electrode. The width of the interconnect electrode may not be 10 μm. The interconnect electrode includes a material having good adhesion with the other layers and low resistivity. In the case where the width of the interconnect electrode is narrow (small), the surface area of the absorption region with respect to the emitted light decreases. Thereby, the light extraction efficiency increases. In the case where the width of the interconnect electrode is wide, the interconnect resistance decreases; and the current spreading increases. Thereby, the luminous efficiency increases; the operating voltage decreases; and the life is longer.

The interconnect resistance of the interconnect electrode can be reduced by setting the thickness of the interconnect electrode to be thick. In the case where the thickness of the interconnect electrode is excessively thick, the polishing amount (the thickness) that is necessary in the planarizing in the CMP process becomes large.

A solder layer may be provided in a portion of the first connection electrode 51. For example, the solder layer may be provided on the surface of the first metal unit 51a in the state prior to bonding the first light emitting unit 10u and the second light emitting unit 20u. For example, the solder layer may be provided on the surface of the second metal unit 51b in the state prior to the bonding. For example, a more reliable bond is obtained by bonding the first metal unit 51a and the second metal unit 51b to each other with the solder layer.

FIG. 7A to FIG. 7D are schematic views illustrating another semiconductor light emitting element according to the first embodiment.

Figure 7A:
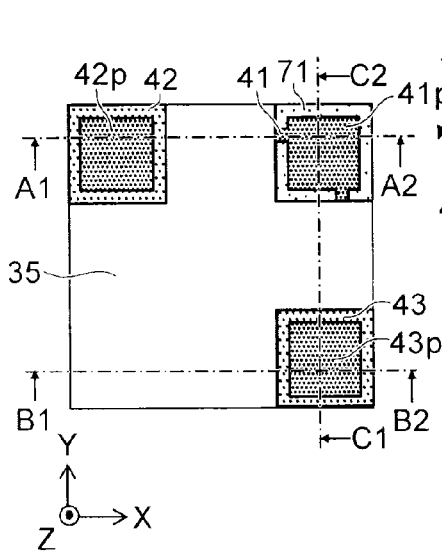
FIG. 7A to FIG. 7D are schematic views showing another semiconductor light emitting element according to the first embodiment.
Figure 7B:
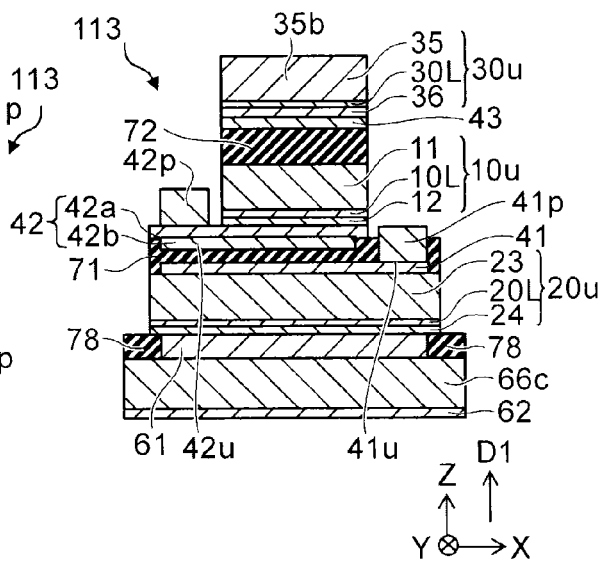
Figure 7C:
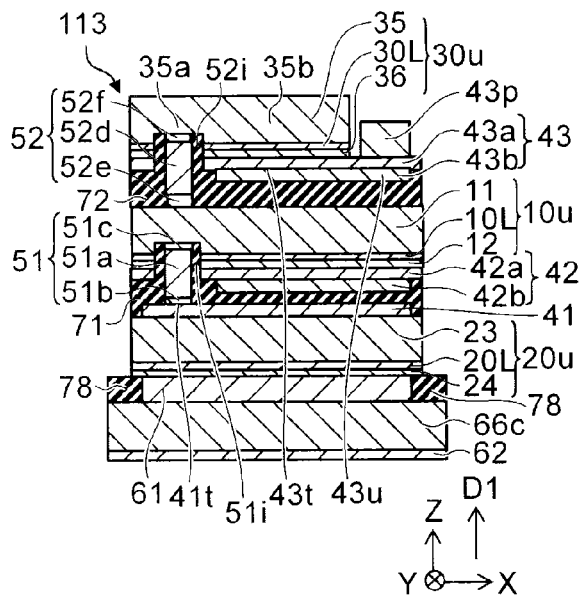
Figure 7D:
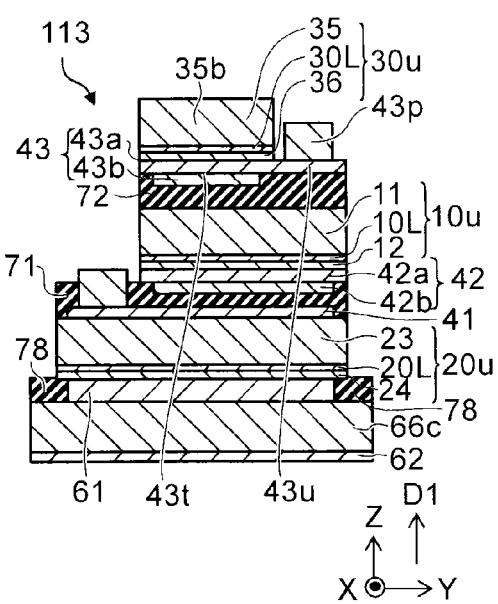

FIG. 7A is a plan view. FIG. 7B is a line A1-A2 cross-sectional view of FIG. 1A. FIG. 7C is a line B1-B2 cross-sectional view of FIG. 7A. FIG. 7D is a line C1-C2 cross-sectional view of FIG. 7A.

As shown in FIG. 7B to FIG. 7D, the semiconductor light emitting element 113 according to the embodiment further includes a third light emitting unit 30u, a third pad 43p, and a second inter-light emitting unit dielectric layer 72 in addition to the first electrode 61, the first light emitting unit 10u, the second light emitting unit 20u, the first connection electrode 51, the first dielectric layer 51i, the first pad 41p, the second pad 42p, and the first inter-light emitting unit dielectric layer 71. In the example, the first conductive layer 41, the second conductive layer 42, and a third conductive layer 43 are provided.

In the semiconductor light emitting element 113, configurations that are similar to those of the semiconductor light emitting element 110 are applicable to the first electrode 61, the first light emitting unit 10u, the second light emitting unit 20u, the first connection electrode 51, the first dielectric layer 51i, the first pad 41p, the second pad 42p, the first inter-light emitting unit dielectric layer 71, the first conductive layer 41, and the second conductive layer 42; and a description is omitted. The third light emitting unit 30u, the third pad 43p, the second inter-light emitting unit dielectric layer 72, and the third conductive layer 43 will now be described.

The first light emitting unit 10u is disposed between the third light emitting unit 30u and the second light emitting unit 20u. The third light emitting unit 30u includes a fifth semiconductor layer 35, a sixth semiconductor layer 36, and a third light emitting layer 30L.

The fifth semiconductor layer 35 is separated from the first light emitting unit 10u in the first direction D1. The fifth semiconductor layer 35 has a fifth conductivity type. The first light emitting unit 10u is disposed between the fifth semiconductor layer 35 and the second light emitting unit 20u. The fifth semiconductor layer 35 includes a third semiconductor portion 35a and a fourth semiconductor portion 35b. The fourth semiconductor portion 35b is arranged with the third semiconductor portion 35a in a direction crossing the first direction D1.

The sixth semiconductor layer 36 is provided between the fourth semiconductor portion 35b and the first light emitting unit 10u. The sixth semiconductor layer 36 has a sixth conductivity type. The sixth conductivity type is different from the fifth conductivity type.

The third light emitting layer 30L is provided between the fourth semiconductor portion 35b and the sixth semiconductor layer 36. The third light emitting layer 30L emits a third light. The third light has a third peak wavelength. The third peak wavelength is different from the first peak wavelength and different from the second peak wavelength.

For example, the fifth conductivity type is the same as the third conductivity type. For example, the sixth conductivity type is the same as the second conductivity type. For example, the first conductivity type, the third conductivity type, and the fifth conductivity type are the n-type; and the second conductivity type, the fourth conductivity type, and the sixth conductivity type are the p-type. In the embodiment, the first conductivity type, the third conductivity type, and the fifth conductivity type may be the p-type; and the second conductivity type, the fourth conductivity type, and the sixth conductivity type may be the n-type. In the embodiment, the first to sixth conductivity types are arbitrary. Hereinbelow, the case where the first conductivity type, the third conductivity type, and the fifth conductivity type are the n-type and the second conductivity type, the fourth conductivity type, and the sixth conductivity type are the p-type will be described.

A second connection electrode 52 is electrically connected with the third semiconductor portion 35a. The second connection electrode 52 extends in the first direction D1 and is electrically connected with the first semiconductor layer 11.

A second dielectric layer 52i is provided between the second connection electrode 52 and the sixth semiconductor layer 36 and between the second connection electrode 52 and the third light emitting layer 30L.

The third pad 43p is electrically connected with the sixth semiconductor layer 36.

The second inter-light emitting unit dielectric layer 72 is provided between the third light emitting unit 30u and the first light emitting unit 10u. The second inter-light emitting unit dielectric layer 72 is light-transmissive.

In the example, the third conductive layer 43 is provided; and the second connection electrode 52 is electrically connected with the third pad 43p via the third conductive layer 43.

The third conductive layer 43 is electrically connected with the sixth semiconductor layer 36. The third conductive layer 43 includes a third inter-layer portion 43t and a third pad disposition portion 43u. The third inter-layer portion 43t is provided between the third light emitting unit 30u and the first light emitting unit 10u. The third pad disposition portion 43u is arranged with the third inter-layer portion 43t in a direction crossing the first direction D1.

The third pad 43p is electrically connected with the third pad disposition portion 43u. The second dielectric layer 52i is further disposed between the second connection electrode 52 and the third conductive layer 43. In the example, the third conductive layer 43 is disposed between the third pad 43p and the first light emitting unit 10u.

In the example, the third conductive layer 43 includes a second light-transmissive conductive unit 43a and a second interconnect unit 43b. The second light-transmissive conductive unit 43a is provided between the third light emitting unit 30u and the second inter-light emitting unit dielectric layer 72. The second light-transmissive conductive unit 43a is electrically connected with the sixth semiconductor layer 36.

The second light-transmissive conductive unit 43a includes, for example, an oxide including at least one element selected from the group consisting of In, Sn, Zn, and Ti. The second light-transmissive conductive unit 43a includes, for example, ITO, etc. The second light-transmissive conductive unit 43a may include a thin film of a metal.

The second interconnect unit 43b is provided between the second light-transmissive conductive unit 43a and the second inter-light emitting unit dielectric layer 72. The second interconnect unit 43b is electrically connected with the second light-transmissive conductive unit 43a. The optical transmittance of the second interconnect unit 43b is lower than the optical transmittance of the second light-transmissive conductive unit 43a. The second interconnect unit 43b includes, for example, at least one selected from Au, Al, Ti, and Pt.

In the example, at least a portion of the second light-transmissive conductive unit 43a is disposed between the third pad 43p and the first light emitting unit 10u. In other words, the second light-transmissive conductive unit 43a is provided on the first light emitting unit 10u; and the third pad 43p is provided on the second light-transmissive conductive unit 43a.

The first pad 41p also functions as the n-side pad of the third light emitting unit 30u. For example, the first pad 41p is electrically connected with the first semiconductor layer 11 of the first light emitting unit 10u via the first conductive layer 41 and the first connection electrode 51. The first semiconductor layer 11 is electrically connected with the fifth semiconductor layer 35 of the third light emitting unit 30u via the second connection electrode 52.

On the other hand, the third pad 43p functions as the p-side pad of the third light emitting unit 30u. In other words, the third pad 43p is connected with the sixth semiconductor layer 36 via the third conductive layer 43.

By applying a voltage first pad 41p and the third pad 43p, a current is supplied to the third light emitting layer 30L; and light (the third light) is emitted from the third light emitting layer 30L.

It is favorable for the third peak wavelength of the third light to be longer than the first peak wavelength of the first light. Also, it is favorable for the first peak wavelength of the first light to be longer than the second peak wavelength of the second light. Thereby, the absorption is suppressed; and the light extraction efficiency increases.

For example, the second light that is emitted from the second light emitting layer 20L is blue light; the first light that is emitted from the first light emitting layer 10L is green light; and the third light that is emitted from the third light emitting layer 30L is red light. However, in the embodiment, the colors (the peak wavelengths) of the light emitted from the light emitting units are arbitrary.

In the example, the second connection electrode 52 includes a fourth metal unit 52d and a fifth metal unit 52e. The fourth metal unit 52d is disposed between the third semiconductor portion 35a and at least a portion of the fifth metal unit 52e. The fourth metal unit 52d may contact, for example, the third semiconductor portion 35a. In the example, the second connection electrode 52 further includes a sixth metal unit 52f. The sixth metal unit 52f is provided between the fourth metal unit 52d and the third semiconductor portion 35a. The sixth metal unit 52f is, for example, the n-side electrode of the third light emitting unit 30u. The fifth metal unit 52e is, for example, the n-side electrode of the first light emitting unit 10u.

The sixth metal unit 52f includes a material having ohmic properties with the fifth semiconductor layer 35 and a low contact resistance. The fifth metal unit 52e includes, for example, a material having ohmic properties with the first semiconductor layer 11 and a low contact resistance. In the example, the conductive layer 11el described in regard to FIG. 1A and FIG. 1B may be further provided (the conductive layer 11el is not shown in FIG. 7C, etc.). In such a case, the fifth metal unit 52e may be connected with, for example, the conductive layer 11el with good adhesion. For example, a metal film including at least one selected from the group consisting of Al, Ti, Cu, Ag, and Ta may be used as the sixth metal unit 52f and the fifth metal unit 52e. An alloy including the at least one selected from the group may be used. A stacked film including multiple metal films of the at least one selected from the group may be used.

The fourth metal unit 52d can electrically connect the fifth metal unit 52e and the sixth metal unit 52f. For example, the fourth metal unit 52d may include a metal film including at least one selected from the group consisting of Al, Ti, Cu, Ag, Au, W, and Ni. An alloy including the at least one selected from the group may be used. A stacked film including multiple metal films of the at least one selected from the group may be used.

As shown in FIG. 7A, the first pad 41p does not overlap the second pad 42p when projected onto the X-Y plane. The third pad 43p overlaps neither the first pad 41p nor the second pad 42p when projected onto the X-Y plane.

FIG. 8A to FIG. 8F are schematic views illustrating another semiconductor light emitting element according to the first embodiment.

Figure 8A:
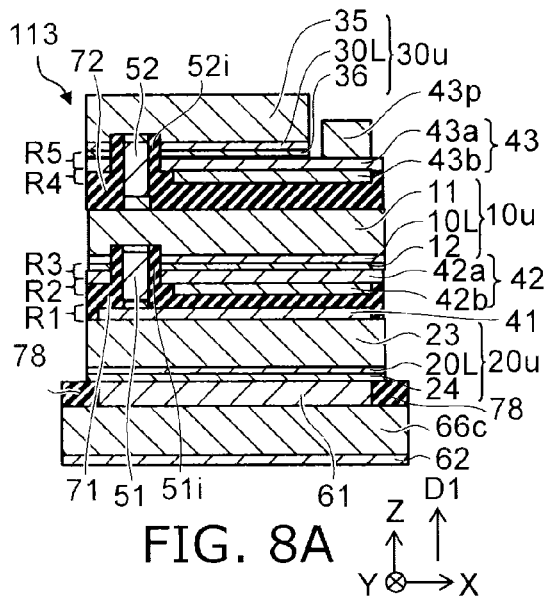
FIG. 8A to FIG. 8F are schematic views showing another semiconductor light emitting element according to the first embodiment.
Figure 8B:
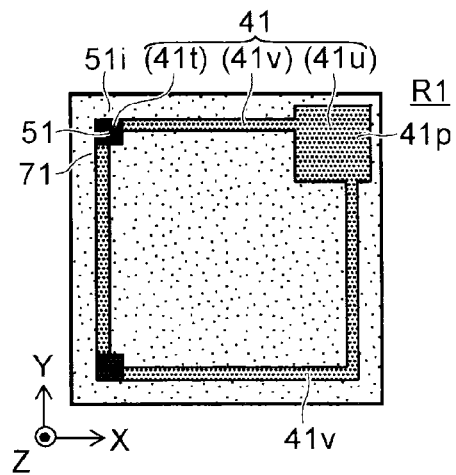
Figure 8C:
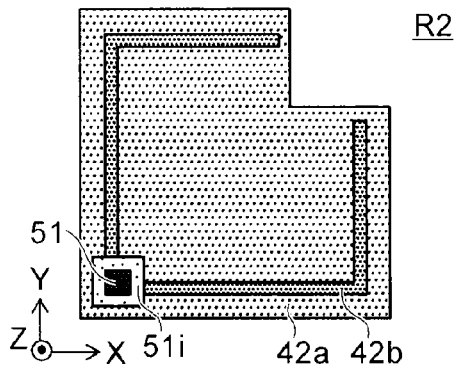

FIG. 8A is a cross-sectional view of the same cross section as FIG. 8C. FIG. 8B to FIG. 8F are schematic see-through plan views corresponding to the regions R1 to R5 shown in FIG. 8A. The regions R1 to R5 are regions parallel to the X-Y plane. The region R1 is the region including the first pad 41p and the first conductive layer 41. The region R2 is the region including the first light-transmissive conductive unit 42a and the first interconnect unit 42b. The region R3 is the region including the second pad 42p and the first light-transmissive conductive unit 42a. The region R4 is the region including the second light-transmissive conductive unit 43a and the second interconnect unit 43b. The region R5 is the region including the third pad 43p and the second light-transmissive conductive unit 43a.

As shown in FIG. 8B, the semiconductor light emitting element 110 has a substantially rectangular planar configuration. In the region R1 in the example, the first conductive layer 41 is provided along the sides of the rectangle. The first connection electrode 51 and the first pad 41p are connected by the first conductive layer 41. The portion around the first connection electrode 51 is used as the first dielectric layer 51i. The remaining portion is used as the first inter-light emitting unit dielectric layer 71.

As shown in FIG. 8C, the first light-transmissive conductive unit 42a and the first interconnect unit 42b are provided in the region R2. The first light-transmissive conductive unit 42a and the first interconnect unit 42b are electrically connected with each other. The first dielectric layer 51i is provided between the first connection electrode 51 and the first light-transmissive conductive unit 42a and between the first connection electrode 51 and the first interconnect unit 42b.

As shown in FIG. 8B and FIG. 8C, in such a case as well, at least a portion of the first conductive layer 41 and at least a portion of the first interconnect unit 42b overlap each other when projected onto the X-Y plane. For example, when projected onto the X-Y plane, at least a portion of the first extension portion 41v of the first conductive layer 41 and at least a portion of the first interconnect unit 42b overlap each other.

Figure 8D:
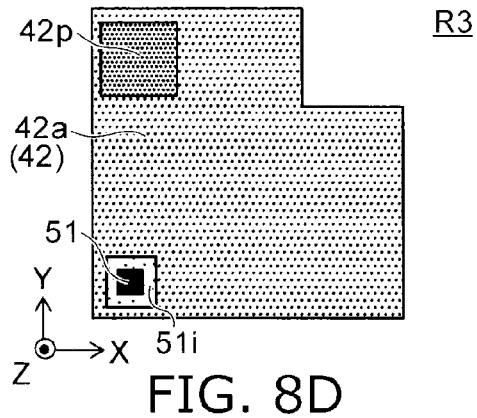

As shown in FIG. 8D, the first light-transmissive conductive unit 42a and the second pad 42p are provided in the region R3. The first light-transmissive conductive unit 42a and the second pad 42p are electrically connected with each other. The first dielectric layer 51i is provided between the first connection electrode 51 and the first light-transmissive conductive unit 42a. These conductive units are insulated from each other.

Figure 8E:
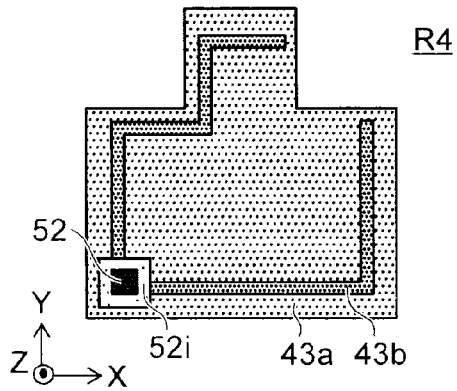

As shown in FIG. 8E, the second light-transmissive conductive unit 43a and the second interconnect unit 43b are provided in the region R4. The second light-transmissive conductive unit 43a and the second interconnect unit 43b are electrically connected with each other. The second dielectric layer 52i is provided between the second connection electrode 52 and the second light-transmissive conductive unit 43a and between the second connection electrode 52 and the second interconnect unit 43b.

As shown in FIG. 8B and FIG. 8E, at least a portion of the first conductive layer 41 and at least a portion of the second interconnect unit 43b overlap each other when projected onto the X-Y plane. For example, when projected onto the X-Y plane, at least a portion of the first extension portion 41v of the first conductive layer 41 and at least a portion of the second interconnect unit 43b overlap each other.

Figure 8F:
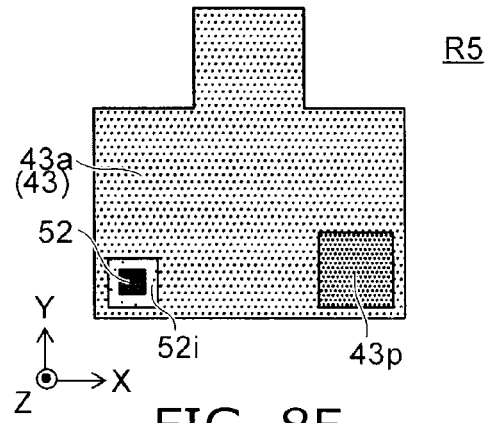

As shown in FIG. 8F, the second light-transmissive conductive unit 43a and the third pad 43p are provided in the region R5. The second light-transmissive conductive unit 43a and the third pad 43p are electrically connected with each other. The second dielectric layer 52i is provided between the second connection electrode 52 and the second light-transmissive conductive unit 43a. These conductive units are insulated from each other.

According to the semiconductor light emitting element 113, a stacked semiconductor light emitting element having a high efficiency can be provided. In the semiconductor light emitting element 113, various modifications of the pattern arrangements of the components are possible.

For example, an example of the method for manufacturing the semiconductor light emitting element 113 will now be described.

The processes described in regard to the semiconductor light emitting element 110 are applicable to the processes of the semiconductor light emitting element 113 up to the bonding of the first light emitting unit 10u and the second light emitting unit 20u. Examples of the formation of the third light emitting unit 30u and the bonding of the third light emitting unit 30u and the first light emitting unit 10u will now be described.

A stacked body (a semiconductor wafer) that includes the third light emitting unit 30u is formed by processes similar to those of the first light emitting unit 10u. A connection electrode is formed by making a hole from the surface (the sixth semiconductor layer 36) of the stacked body to reach the fifth semiconductor layer 35 and by filling a conductive material into the hole. For example, the hole overlaps the first connection electrode 51 when projected onto the X-Y plane. A Cu layer is formed by lift-off; and the hole is filled with the Cu layer. The thickness of the Cu layer is, for example, about 200 nm (e.g., not less than 100 nm and not more than 800 nm). Thereby, a portion (the fourth metal unit 52d) of the second connection electrode 52 is formed. In the description recited above, the sixth metal unit 52f may be formed prior to the formation of the fourth metal unit 52d.

A light-transmissive insulating layer (e.g., a SiO$_2$ film) that is used to form a portion of the second inter-light emitting unit dielectric layer 72 is formed to cover the sixth metal unit 52f.

The connection electrode (the fourth metal unit 52d) may be formed after the formation of the light-transmissive insulating layer (e.g., the SiO$_2$ film). The method for forming the connection electrode (the fourth metal unit 52d) includes, for example, lift-off combined with vapor deposition, sputtering, CVD, plating, or a combination of these methods.

The light-transmissive insulating layer (e.g., the SiO$_2$ film) recited above is planarized by CMP processing. At this time, the connection electrode (the fourth metal unit 52d) recited above is exposed.

On the other hand, for example, a light-transmissive insulating layer (e.g., a SiO$_2$ film) is formed on the surface of the first light emitting unit 10u (the surface of the first semiconductor layer 11). The light-transmissive insulating layer that is formed on the surface of the first light emitting unit 10u and the light-transmissive insulating layer recited above that is formed on the surface of the third light emitting unit 30u are caused to oppose each other and are bonded.

Similarly to the description of the semiconductor light emitting element 110, dry etching or wet etching of the crystal layers and the light-transmissive insulating layers is performed; and the pads recited above are formed. Thereby, the semiconductor light emitting element 113 is formed.

Three light emitting layers are provided in the semiconductor light emitting element 113. Similar to the description recited above, four or more light emitting layers may be stacked by implementing the processes.

In the semiconductor light emitting element 113, for example, the light emission wavelengths of the light emitting layers are, for example, red, green, and blue. Thereby, for example, a white LED can be realized without using a fluorescer. Stokes shift loss occurs due to the wavelength conversion of fluorescers. Therefore, in the case where a fluorescer is used, it is difficult to sufficiently increase the luminous efficiency. In the embodiment, a high luminous efficiency is obtained because it is unnecessary to use a fluorescer. A fluorescer may be used in the embodiment.

FIG. 9 is a schematic cross-sectional view illustrating another semiconductor light emitting element according to the first embodiment.

FIG. 9 is a schematic view of a cross section corresponding to the line B1-B2 cross section of FIG. 7A.

Similarly to the conductive layer 11el described in regard to FIG. 1A to FIG. 1B, in the semiconductor light emitting element 113a according to the embodiment as shown in FIG. 9, a conductive layer 35el is further provided on the fifth semiconductor layer 35. Otherwise, the semiconductor light emitting element 113a according to the embodiment is similar to the semiconductor light emitting element 113.

In the semiconductor light emitting element 113a, the fifth semiconductor layer 35 is disposed between the conductive layer 35el and the third light emitting layer 30L. The conductive layer 35el is used as, for example, the n-side electrode of the third light emitting unit 30u. By providing the conductive layer 35el, the current spreading of the fifth semiconductor layer 35 of the third light emitting unit 30u increases. Thereby, the operating voltage decreases; and the luminous efficiency increases. At least a portion of the conductive layer 35el may overlap at least a portion of at least one selected from the conductive layer 11el, the first conductive layer 41, and the first interconnect unit 42b when projected onto the X-Y plane. Thereby, color breakup is suppressed; and the absorption of the emitted light by the conductive layer 35el is suppressed. Thereby, the uneven color can be reduced; and the light extraction efficiency can be increased. The conductive layer 35el may be light-transmissive. The conductive layer 35el may be provided as necessary and may be omitted.

FIG. 10A and FIG. 10B are schematic cross-sectional views illustrating other semiconductor light emitting elements according to the first embodiment.

These drawings illustrate a portion of the third light emitting unit 30u.

In the semiconductor light emitting element 113b as shown in FIG. 10A, the third light emitting unit 30u has a surface 35u on the side opposite to the first light emitting unit 10u. The surface 35u is a surface on the light extraction side of the semiconductor light emitting element. In the semiconductor light emitting element 113a, an unevenness 35pd is provided in the surface 35u. In the example, the unevenness is provided in the surface of the fifth semiconductor layer 35.

In the semiconductor light emitting element 113c as shown in FIG. 10B, the fifth semiconductor layer 35 of the third light emitting unit 30u includes a high impurity concentration layer 35P and a low impurity concentration layer 35q having the fifth conductivity type. The high impurity concentration layer 35P is provided between the low impurity concentration layer 35q and the third light emitting layer 30L. The impurity concentration of the low impurity concentration layer 35q is lower than the impurity concentration of the high impurity concentration layer 35P. The high impurity concentration layer 35P is, for example, an n-type GaN layer. The low impurity concentration layer 35q is, for example, an undoped GaN layer. An AlGaN or AlN layer may be used as the low impurity concentration layer 35q. Even in the case where the low impurity concentration layer 35q is an undoped semiconductor layer, the low impurity concentration layer 35q also is included in the fifth semiconductor layer 35 for convenience.

In the semiconductor light emitting element 113b, the surface 35u is the surface of the low impurity concentration layer 35q. In such a case as well, the unevenness 35pd is provided in the surface (the surface 35u) of the low impurity concentration layer 35q.

In the semiconductor light emitting elements 113a and 113b, the light is emitted to the outside by passing through the third light emitting unit 30u. In the semiconductor light emitting elements 113a and 113b, the surface 35u is the surface on the light extraction side. The light extraction efficiency can be increased by providing the unevenness 35pd in the surface 35u.

Figure 11:
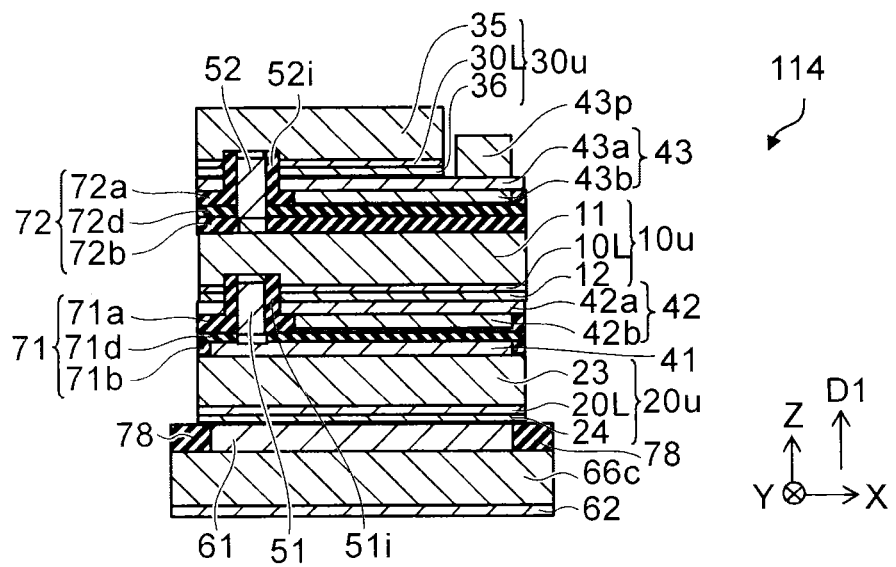
FIG. 11 is a schematic cross-sectional view showing another semiconductor light emitting element according to the first embodiment.

FIG. 11 is a schematic cross-sectional view illustrating another semiconductor light emitting element according to the first embodiment. FIG. 11 is a cross-sectional view corresponding to the line A1-A2 cross section of FIG. 7A.

In the semiconductor light emitting element 114 according to the embodiment as shown in FIG. 11, a second optical layer 72d is provided in the second inter-light emitting unit dielectric layer 72 provided between the third light emitting unit 30u and the first light emitting unit 10u.

In the example, the second inter-light emitting unit dielectric layer 72 includes a third dielectric film 72a, a fourth dielectric film 72b, and the second optical layer 72d. The third dielectric film 72a is disposed between the first light emitting unit 10u and the second light emitting unit 20u. The fourth dielectric film 72b is disposed between the second light emitting unit 20u and the third dielectric film 72a. In the example, the second optical layer 72d is disposed between the third dielectric film 72a and the fourth dielectric film 72b.

The second optical layer 72d transmits the light (the first light) emitted from the first light emitting layer 10L and reflects the light (the third light) emitted from the third light emitting layer 30L. The second optical layer 72d is, for example, a dichromic mirror.

The transmittance of the second optical layer 72d for the first light is higher than the transmittance of the second optical layer 72d for the third light. The reflectance of the second optical layer 72d to the third light is higher than the reflectance of the second optical layer 72d to the first light.

The transmittance of the second optical layer 72d for the second light is higher than the transmittance of the second optical layer 72d for the third light. The reflectance of the second optical layer 72d to the third light is higher than the reflectance of the second optical layer 72d to the second light.

For example, the second optical layer 72d may be provided between the third dielectric film 72a and the first light emitting unit 10u. For example, the second optical layer 72d may be provided between the fourth dielectric film 72b and the second light emitting unit 20u.

At least a portion of the second optical layer 72d may be formed by, for example, adjusting the thickness of the $SiO_2$ film (the fourth dielectric film 72b) of the lower layer for bonding. At least a portion of the second optical layer 72d may be formed by, for example, adjusting the thickness of the $SiO_2$ film (the third dielectric film 72a) of the upper layer for bonding.

The second optical layer 72d may include the same material as the third dielectric film 72a or a different material. The second optical layer 72d may include the same material as the fourth dielectric film 72b or a different material.

The second optical layer 72d may include any material that is transmissive to the first light and the second light. The second optical layer 72d has bonding strength and is insulative.

Second Embodiment

Figure 12:
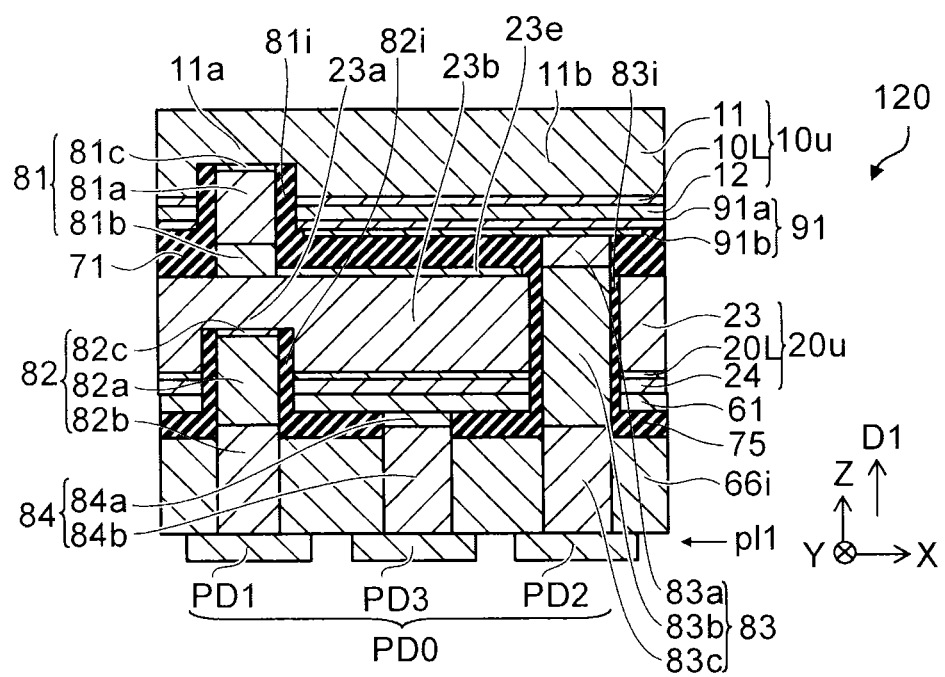
FIG. 12 is a schematic cross-sectional view showing a semiconductor light emitting element according to a second embodiment.

FIG. 12 is a schematic cross-sectional view illustrating a semiconductor light emitting element according to a second embodiment.

As shown in FIG. 12, the semiconductor light emitting element 120 according to the embodiment includes a pad unit PD0, the first light emitting unit 10u, the second light emitting unit 20u, the first electrode 61, an insulating support layer 66i, a first conductive layer 91, the first inter-light emitting unit dielectric layer 71, a first connection electrode 81, a second connection electrode 82, a third connection electrode 83, a fourth connection electrode 84, a first dielectric layer 81i, a second dielectric layer 82i, and a third dielectric layer 83i.

The pad unit PD0 includes a first pad PD1, a second pad PD2, and a third pad PD3. The second pad PD2 is separated from the first pad PD1 in a first surface p/1. The third pad PD3 is separated from the first pad PD1 and separated from the second pad PD2 in the first surface p/1.

For example, the first surface p/1 intersects the Z-axis direction. One direction perpendicular to the Z-axis direction is taken as an X-axis direction. A direction perpendicular to the Z-axis direction and the X-axis direction is taken as a Y-axis direction. The Z-axis direction is taken to be parallel to the first direction D1.

The first light emitting unit 10u includes the first semiconductor layer 11, the second semiconductor layer 12, and the first light emitting layer 10L.

The first semiconductor layer 11 is separated from the pad unit PD0 in the first direction D1 (a direction intersecting the first surface p/1). In the example, the first direction D1 is perpendicular to the first surface p/1. The first semiconductor layer 11 includes the first semiconductor portion 11a and the second semiconductor portion 11b. The second semiconductor portion 11b is arranged with the first semiconductor portion 11a in a direction crossing the first direction D1. The first semiconductor layer 11 has the first conductivity type.

The second semiconductor layer 12 is provided between the second semiconductor portion 11b and the pad unit PD0. The second semiconductor layer 12 has the second conductivity type. The second conductivity type is different from the first conductivity type.

The first light emitting layer 10L is provided between the second semiconductor portion 11b and the second semiconductor layer 12. The first light emitting layer 10L emits the first light. The first light has the first peak wavelength.

The second light emitting unit 20u is provided between the first light emitting unit 10u and the pad unit PD0. The second light emitting unit 20u includes the third semiconductor layer 23, the fourth semiconductor layer 24, and the second light emitting unit 20u.

The third semiconductor layer 23 is provided between the pad unit PD0 and the first light emitting unit 10u. The third semiconductor layer 23 includes a third semiconductor portion 23a and a fourth semiconductor portion 23b. The fourth semiconductor portion 23b is arranged with the third semiconductor portion 23a in a direction intersecting the first direction D1. The third semiconductor layer 23 has the third conductivity type.

The fourth semiconductor layer 24 is provided between the fourth semiconductor portion 23b and the pad unit PD0. The fourth semiconductor layer 24 has the fourth conductivity type. The fourth conductivity type is different from the third conductivity type.

The second light emitting layer 20L is provided between the fourth semiconductor portion 23b and the fourth semiconductor layer 24. The second light emitting layer 20L emits the second light. The second light has the second peak wavelength.

The first electrode 61 is provided between the pad unit PD0 and the second light emitting unit 20u and is reflective. The insulating support layer 66i is provided between the pad unit PD0 and the first electrode 61.

The first conductive layer 91 is provided between the first light emitting unit 10u and the second light emitting unit 20u. The first conductive layer 91 extends in a direction crossing the first direction D1. The first conductive layer 91 is electrically connected with the second semiconductor layer 12.

The first inter-light emitting unit dielectric layer 71 is provided between the first light emitting unit 10u and the second light emitting unit 20u and between the first conductive layer 91 and the second light emitting unit 20u and is light-transmissive.

The first connection electrode 81 is provided between the first semiconductor portion 11a and the third semiconductor layer 23 and pierces the first inter-light emitting unit dielectric layer 71 in the first direction D1. The first connection electrode 81 electrically connects the first semiconductor portion 11a and the third semiconductor layer 23.

The first dielectric layer 81i is provided between the first connection electrode 81 and the second semiconductor layer 12, between the first connection electrode 81 and the first light emitting layer 10L, and between the first connection electrode 81 and the first conductive layer 91.

The second connection electrode 82 is provided between the third semiconductor portion 23a and the first pad PD1. The second connection electrode 82 pierces the insulating support layer 66i in the first direction D1. The second connection electrode 82 electrically connects the third semiconductor portion 23a and the first pad PD1.

The second dielectric layer 82i is provided between the second connection electrode 82 and the fourth semiconductor layer 24, between the second connection electrode 82 and the second light emitting layer 20L, and between the second connection electrode 82 and the first electrode 61.

The third connection electrode 83 is provided between the first conductive layer 91 and the second pad PD2. The third connection electrode 83 pierces the first inter-light emitting unit dielectric layer 71, the second light emitting unit 20u, and the insulating support layer 66i in the first direction D1. The third connection electrode 83 electrically connects the first conductive layer 91 and the second pad PD2.

The third dielectric layer 83i is provided between the third connection electrode 83 and the second light emitting unit 20u and between the third connection electrode 83 and the first electrode 61.

The fourth connection electrode 84 is provided between the first electrode 61 and the third pad PD3. The fourth connection electrode 84 pierces the insulating support layer 66i in the first direction D1 and electrically connects the first electrode 61 and the third pad PD3.

For example, the first conductivity type is the same as the third conductivity type. For example, the second conductivity type is the same as the fourth conductivity type. For example, the first conductivity type and the third conductivity type are the n-type; and the second conductivity type and the fourth conductivity type are the p-type. In the embodiment, the first conductivity type and the third conductivity type may be the p-type; and the second conductivity type and the fourth conductivity type may be the n-type. In the embodiment, the first to fourth conductivity types are arbitrary. Hereinbelow, the case is described where the first conductivity type and the third conductivity type are the n-type and the second conductivity type and the fourth conductivity type are the p-type.

In the semiconductor light emitting element 120, the first pad PD1 is electrically connected with the third semiconductor layer 23 via the second connection electrode 82. The third semiconductor layer 23 is electrically connected with the first semiconductor layer 11 via the first connection electrode 81. In other words, the first pad PD1 is connected with both the third semiconductor layer 23 and the first semiconductor layer 11. The first pad PD1 functions as, for example, the n-type electrode of the first light emitting unit 10u and the second light emitting unit 20u.

The second pad PD2 is electrically connected with the second semiconductor layer 12 via the third connection electrode 83 and the first conductive layer 91. The second pad PD2 functions as, for example, the p-side electrode of the first light emitting unit 10u.

The third pad PD3 is electrically connected with the fourth semiconductor layer 24 via the fourth connection electrode 84 and the first electrode 61. The third pad PD3 functions as, for example, the p-side electrode of the second light emitting unit 20u.

By applying a voltage between the first pad PD1 and the third pad PD3, a current is supplied to the second light emitting layer 20L; and light (the second light) is emitted from the second light emitting layer 20L. By applying a voltage between the first pad PD1 and the second pad PD2, a current is supplied to the second light emitting layer 20L; and light (the first light) is emitted from the first light emitting layer 10L.

For example, the second peak wavelength is shorter than the first peak wavelength. For example, the second light is blue light; and the first light is at least one selected from yellow light and green light. The color (the peak wavelength) of the light is arbitrary.

According to the embodiment, a stacked semiconductor light emitting element having a high efficiency can be provided. In the embodiment, a pad is not provided on the side of the light extraction surface. Thereby, the light extraction efficiency increases further.

Thus, in the embodiment, via electrodes (connection electrodes) are used as the conduction paths to the crystal layers. The via electrodes may be made similarly to the methods described in the first embodiment.

Further, in the embodiment, the third light emitting unit may be provided. The first light emitting unit 10u is disposed between the third light emitting unit and the second light emitting unit 20u. In such a case, for example, the second light that is emitted from the second light emitting layer 20L is blue light; the first light that is emitted from the first light emitting layer 10L is green light; and the third light that is emitted from the third light emitting layer of the third light emitting unit is red light.

In the example, the first connection electrode 81 includes a first metal unit 81a and a second metal unit 81b. The first metal unit 81a is disposed between the first semiconductor portion 11a and at least a portion of the second metal unit 81b. The first metal unit 81a may contact, for example, the first semiconductor portion 11a. In the example, the first connection electrode 81 further includes a third metal unit 81c. The third metal unit 81c is provided between the first metal unit 81a and the first semiconductor portion 11a. The third metal unit 81c is, for example, the n-side electrode of the first light emitting unit 10u. The second metal unit 81b is, for example, the n-side electrode of the second light emitting unit 20u.

The third metal unit 81c includes a material having ohmic properties with the first semiconductor layer 11 and a low contact resistance. The second metal unit 81b may include, for example, a material having ohmic properties with the third semiconductor layer 23 and a low contact resistance. The second metal unit 81b may be bonded with good adhesion to, for example, a third semiconductor layer electrode 23e described below. For example, a metal film including at least one selected from the group consisting of Al, Ti, Cu, Ag, and Ta may be used as the first metal unit 81a and the second metal unit 81b. An alloy including the at least one selected from the group may be used. A stacked film including multiple metal films of the at least one selected from the group may be used.

The first metal unit 81a can electrically connect the second metal unit 81b and the third metal unit 81c. For example, the first metal unit 81a may include a metal film including at least one selected from the group consisting of Al, Ti, Cu, Ag, Au, W, and Ni. An alloy including the at least one selected from the group may be used. A stacked film including multiple metal films of the at least one selected from the group may be used.

In the example, the second connection electrode 82 includes a fourth metal unit 82a and a fifth metal unit 82b. The fourth metal unit 82a is disposed between the third semiconductor portion 23a and at least a portion of the fifth metal unit 82b. The fourth metal unit 82a may contact, for example, the third semiconductor portion 23a. In the example, the second connection electrode 82 further includes a sixth metal unit 82c. The sixth metal unit 82c is provided between the fourth metal unit 82a and the third semiconductor portion 23a. The sixth metal unit 82c is, for example, the n-side electrode of the second light emitting unit 20u.

In the example, the third connection electrode 83 includes a seventh metal unit 83a, an eighth metal unit 83b, and a ninth metal unit 83c. The eighth metal unit 83b is disposed between the first conductive layer 91 and at least a portion of the ninth metal unit 83c. The seventh metal unit 83a is disposed between the first conductive layer 91 and at least a portion of the eighth metal unit 83b.

In the example, the fourth connection electrode 84 includes a tenth metal unit 84a and an eleventh metal unit 84b. The tenth metal unit 84a is disposed between the first electrode 61 and at least a portion of the eleventh metal unit 84b.

At least one selected from the first metal unit 81a, the second metal unit 81b, the fourth metal unit 82a, the fifth metal unit 82b, the seventh metal unit 83a, the eighth metal unit 83b, the ninth metal unit 83c, the tenth metal unit 84a, and the eleventh metal unit 84b includes, for example, at least one selected from Al, Ti, Cu, Ag, Au, W, and Ni. The third metal unit 81c and the sixth metal unit 82c include, for example, at least one selected from Al, Ti, Cu, Ag, and Ta.

In the example, the first conductive layer 91 includes a first light-transmissive conductive unit 91a and a first interconnect unit 91b. The first light-transmissive conductive unit 91a is provided between the first light emitting unit 10u and the first inter-light emitting unit dielectric layer 71. The first light-transmissive conductive unit 91a is electrically connected with the second semiconductor layer 12.

The first light-transmissive conductive unit 91a includes, for example, an oxide including at least one element selected from the group consisting of In, Sn, Zn, and Ti. The first light-transmissive conductive unit 91a includes, for example, ITO, etc. The first light-transmissive conductive unit 91a may include a thin film of a metal. The first light-transmissive conductive unit 91a may be provided as necessary and may be omitted.

The first interconnect unit 91b is provided, for example, between the first light-transmissive conductive unit 91a and the first inter-light emitting unit dielectric layer 71. The first interconnect unit 91b is electrically connected with the first light-transmissive conductive unit 91a. The optical transmittance of the first interconnect unit 91b is lower than the optical transmittance of the first light-transmissive conductive unit 91a. A metal having a low resistivity is suited to the first interconnect unit 91b. The first interconnect unit 91b includes, for example, at least one selected from the group consisting of Al, Au, Ag, and Cu, an alloy including the at least one selected from the group, or a stacked film including a film of the at least one selected from the group. The first interconnect unit 91b may be provided as necessary and may be omitted.

In the example, the third semiconductor layer electrode 23e is provided between the third semiconductor layer 23 and the first inter-light emitting unit dielectric layer 71. The third semiconductor layer electrode 23e is used to form an interconnect electrode for the third semiconductor layer 23. For example, at least a portion of the third semiconductor layer electrode 23e and at least a portion of the first conductive layer 91 overlap each other when projected onto the X-Y plane. Thereby, the surface area of the absorbing regions can be reduced; and the light extraction efficiency increases. The third semiconductor layer electrode 23e may be provided as necessary and may be omitted.

In the example, a light-transmissive bonding layer 75 is provided between the first electrode 61 and the insulating support layer 66i. The bonding layer 75 includes, for example, a $SiO_2$ film, etc. The bonding layer 75 may be provided as necessary and may be omitted.

In the embodiment, the method for depositing the semiconductor layer may include, for example, metal-organic chemical vapor deposition (MOCVD), metal-organic vapor phase epitaxy, etc.

According to the embodiments, a stacked semiconductor light emitting element having a high efficiency can be provided.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting element such as the electrode, the light emitting unit, the semiconductor layer, the light emitting layer, the connection electrode, the dielectric layer, the dielectric film, the metal unit, the optical layer, the support layer, the insulating support layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
   a first electrode;
   a first light emitting unit including
      a first semiconductor layer,
      a second semiconductor layer, and
      a first light emitting layer,
      the first semiconductor layer being separated from the first electrode in a first direction and including a first semiconductor portion and a second semiconductor portion, the second semiconductor portion being arranged with first semiconductor portion in a direction crossing the first direction, the second semiconductor layer being provided between the second semiconductor portion and the first electrode, the first light emitting layer being provided between the second semiconductor portion and the second semiconductor layer;
   a second light emitting unit including
      a third semiconductor layer,
      a fourth semiconductor layer, and
      a second light emitting layer,
      the third semiconductor layer being provided between the first electrode and the first light emitting unit,
      the fourth semiconductor layer being provided between the third semiconductor layer and the first electrode,
      the fourth semiconductor layer being electrically connected with the first electrode, the second light emitting layer being provided between the third semiconductor layer and the fourth semiconductor layer;
   a first conductive layer including
      a first pad disposition portion and
      a first inter-layer portion,
      the first inter-layer portion being provided between the first light emitting unit and the second light emitting unit,
      the first pad disposition portion being arranged with the first inter-layer portion in a direction crossing the first direction, the first conductive layer being electrically connected with the third semiconductor layer;
a second conductive layer including
a second pad disposition portion and
a second inter-layer portion,
the second inter-layer portion being provided between the first light emitting unit and the second light emitting unit,
the second pad disposition portion being arranged with the second inter-layer portion in a direction crossing the first direction,
the second conductive layer being electrically connected with the second semiconductor layer;
a first connection electrode extending in the first direction and electrically connecting the first inter-layer portion and the first semiconductor portion;
a first dielectric layer provided between the first connection electrode and the second semiconductor layer, between the first connection electrode and the first light emitting layer, and between the first connection electrode and the second conductive layer;
a first pad electrically connected with the first pad disposition portion;
a second pad electrically connected with the second pad disposition portion; and
a first inter-light emitting unit dielectric layer provided between the first light emitting unit and the second light emitting unit, between the first light emitting unit and the first conductive layer, between the second conductive layer and the second light emitting unit, and between the first conductive layer and the second conductive layer, the first inter-light emitting unit dielectric layer being light-transmissive.

2. The element according to claim 1, wherein
the first conductive layer is disposed between the first pad and the second light emitting unit, and
the second conductive layer is disposed between the second pad and the second light emitting unit.

3. The element according to claim 1, wherein the second conductive layer includes
a first light-transmissive conductive unit provided between the first light emitting unit and the first inter-light emitting unit dielectric layer, the first light-transmissive conductive unit being electrically connected with the second semiconductor layer, and
a first interconnect unit provided between the first light-transmissive conductive unit and the first inter-light emitting unit dielectric layer, the first interconnect unit being electrically connected with the first light-transmissive conductive unit, an optical transmittance of the first interconnect unit being lower than an optical transmittance of the first light-transmissive conductive unit.

4. The element according to claim 3, wherein at least a portion of the first conductive layer and at least a portion of the first interconnect unit overlap each other when projected onto a plane perpendicular to the first direction.

5. The element according to claim 3, wherein
the first conductive layer further includes a first extension portion extending between the first inter-layer portion and the first pad disposition portion, and
at least a portion of the first extension portion and at least a portion of the first interconnect unit overlap each other when projected onto a plane perpendicular to the first direction.

6. The element according to claim 3, wherein at least a portion of the first light-transmissive conductive unit is disposed between the second pad and the second light emitting unit.

7. The element according to claim 3, wherein at least a portion of the first interconnect unit is disposed between the second pad and the second light emitting unit.

8. The element according to claim 1, wherein the first pad does not overlap the second pad when projected onto a plane perpendicular to the first direction.

9. The element according to claim 1, further comprising: a support layer; and a second electrode, the second electrode being electrically connected with the first electrode,
the first electrode being disposed between the second light emitting unit and the second electrode, and
the support layer being disposed between the first electrode and the second electrode.

10. The element according to claim 9, further comprising a support layer-side dielectric layer provided along an outer edge of the second light emitting unit between the support layer and the second light emitting unit.

11. The element according to claim 1, wherein the first semiconductor layer is of an n-type, the third semiconductor layer is of the n-type, the second semiconductor layer is of a p-type, and the fourth semiconductor layer is of the p-type.

12. The element according to claim 1, wherein
the first inter-light emitting unit dielectric layer includes a first optical layer,
the first light emitting layer is configured to emit a first light having a first peak wavelength,
the second light emitting layer is configured to emit a second light having a second peak wavelength different from the first peak wavelength,
a transmittance of the first optical layer for the second light is higher than a transmittance of the first optical layer for the first light, and
a reflectance of the first optical layer to the first light is higher than a reflectance of the first optical layer to the second light.

13. The element according to claim 1, further comprising:
a third light emitting unit including
a fifth semiconductor layer,
a sixth semiconductor layer, and
a third light emitting layer,
the fifth semiconductor layer being separated from the first light emitting unit in the first direction, the first light emitting unit being disposed between the fifth semiconductor layer and the second light emitting unit, the fifth semiconductor layer including a third semiconductor portion and a fourth semiconductor portion, the fourth semiconductor portion being arranged with the third semiconductor portion in a direction crossing the first direction, the sixth semiconductor layer being provided between the fourth semiconductor portion and the first light emitting unit, the third light emitting layer being provided between the fourth semiconductor portion and the sixth semiconductor layer;
a second connection electrode extending in the first direction and electrically connecting the third semiconductor portion and the first semiconductor layer;
a second dielectric layer provided between the second connection electrode and the sixth semiconductor layer and between the second connection electrode and the third light emitting layer;
a third pad electrically connected with the sixth semiconductor layer; and a second inter-light emitting unit dielectric layer provided between the third light emitting unit and the first light emitting unit, the second inter-light emitting unit dielectric layer being light-transmissive.

14. The element according to claim 13, further comprising a third conductive layer electrically connected with the sixth semiconductor layer,
the third conductive layer including
a third inter-layer portion and
a third pad disposition portion,
the third inter-layer portion being provided between the third light emitting unit and the first light emitting unit,
the third pad disposition portion being arranged with the third inter-layer portion in a direction crossing the first direction,
the third pad being electrically connected with the third pad disposition portion, and
the second dielectric layer being further disposed between the second connection electrode and the third conductive layer.

15. The element according to claim 14, wherein the third conductive layer is disposed between the third pad and the first light emitting unit.

16. The element according to claim 14, wherein the third conductive layer includes
a second light-transmissive conductive unit provided between the third light emitting unit and the second inter-light emitting unit dielectric layer, the second light-transmissive conductive unit being electrically connected with the sixth semiconductor layer, and
a second interconnect unit provided between the second light-transmissive conductive unit and the second inter-light emitting unit dielectric layer, the second interconnect unit being electrically connected with the second light-transmissive conductive unit, an optical transmittance of the second interconnect unit being lower than an optical transmittance of the second light-transmissive conductive unit.

17. The element according to claim 16, wherein at least a portion of the second light-transmissive conductive unit is disposed between the third pad and the first light emitting unit.

18. The element according to claim 13, wherein
the third light emitting unit has a surface on a side opposite to the first light emitting unit, and
the surface on the side opposite to the first light emitting unit is a surface on a light extraction side.

19. A semiconductor light emitting element, comprising:
a pad unit including a first pad, a second pad, and a third pad, the second pad being separated from the first pad in a first surface, the third pad being separated from the first pad and separated from the second pad in the first surface;
a first light emitting unit including
a first semiconductor layer,
a second semiconductor layer, and
a first light emitting layer,
the first semiconductor layer being separated from the pad unit in a first direction and including a first semiconductor portion and a second semiconductor portion, the second semiconductor portion being arranged with the first semiconductor portion in a direction crossing the first direction, the first direction intersecting the first surface, the second semiconductor layer being provided between the second semiconductor portion and the pad unit, the first light emitting layer being provided between the second semiconductor portion and the second semiconductor layer;
a second light emitting unit including
a third semiconductor layer,
a fourth semiconductor layer, and
a second light emitting layer,
the third semiconductor layer being provided between the pad unit and the first light emitting unit and including a third semiconductor portion and a fourth semiconductor portion, the fourth semiconductor portion being arranged with the third semiconductor portion in a direction crossing the first direction, the fourth semiconductor layer being provided between the fourth semiconductor portion and the pad unit, the second light emitting layer being provided between the fourth semiconductor portion and the fourth semiconductor layer;
a first electrode provided between the pad unit and the second light emitting unit;
an insulating support layer provided between the pad unit and the first electrode;
a first conductive layer provided between the first light emitting unit and the second light emitting unit, the first conductive layer extending in the first direction and electrically connected with the second semiconductor layer;
a first inter-light emitting unit dielectric layer provided between the first light emitting unit and the second light emitting unit and between the first conductive layer and the second light emitting unit, the first inter-light emitting unit dielectric layer being light-transmissive;
a first connection electrode provided between the first semiconductor portion and the third semiconductor layer to electrically connect the first semiconductor portion and the third semiconductor layer, the first connection electrode piercing the first inter-light emitting unit dielectric layer in the first direction;
a first dielectric layer provided between the first connection electrode and the second semiconductor layer, between the first connection electrode and the first light emitting layer, and between the first connection electrode and the first conductive layer;
a second connection electrode provided between the third semiconductor portion and the first pad to electrically connect the third semiconductor portion and the first pad, the second connection electrode piercing the insulating support layer in the first direction;
a second dielectric layer provided between the second connection electrode and the fourth semiconductor layer, between the second connection electrode and the second light emitting layer, and between the second connection electrode and the first electrode;
a third connection electrode provided between the first conductive layer and the second pad to electrically connect the first conductive layer and the second pad, the third connection electrode piercing the first inter-light emitting unit dielectric layer, the second light emitting unit and the insulating support layer in the first direction;
a third dielectric layer provided between the third connection electrode and the second light emitting unit and between the third connection electrode and the first electrode; and
a fourth connection electrode provided between the first electrode and the third pad to electrically connect the first electrode and the third pad, the fourth connection electrode piercing the insulating support layer in the first direction.

20. The element according to claim 1, wherein
the first light emitting unit has a surface on a side opposite to the second light emitting unit, and
the surface on the side opposite to the second light emitting unit is a surface on a light extraction side.

* * * * *